(12) United States Patent  
Neureuther et al.

(10) Patent No.: US 7,648,802 B2  
(45) Date of Patent: Jan. 19, 2010

(54) PHASE SHIFTING TEST MASK PATTERNS FOR CHARACTERIZING ILLUMINATION AND MASK QUALITY IN IMAGE FORMING OPTICAL SYSTEMS

(75) Inventors: Andrew R. Neureuther, Berkeley, CA (US); Gregory R. McIntyre, Kensington, CA (US)

(73) Assignee: The Regents of the University of California, Oakland, CA (US)

( * ) Notice: Subject to any disclaimer, the term of this patent is extended or adjusted under 35 U.S.C. 154(b) by 662 days.

(21) Appl. No.: 11/053,725

(22) Filed: Feb. 7, 2005

(65) Prior Publication Data

US 2007/0053576 A1     Mar. 8, 2007

Related U.S. Application Data

(60) Provisional application No. 60/547,552, filed on Feb. 24, 2004.

(51) Int. Cl.
*G03F 1/00* (2006.01)
*G06K 9/00* (2006.01)
*G01B 11/24* (2006.01)
*G03C 5/00* (2006.01)

(52) U.S. Cl. .............................. 430/5; 430/30; 382/144; 356/601

(58) Field of Classification Search ...................... 430/5, 430/22, 30; 355/67; 356/601, 609; 382/144
See application file for complete search history.

(56) References Cited

U.S. PATENT DOCUMENTS

2003/0103189 A1* 6/2003 Neureuther et al. ......... 351/176
2004/0027553 A1* 2/2004 Henke et al. ................... 355/77
2004/0245439 A1* 12/2004 Shaver ........................ 250/225

OTHER PUBLICATIONS

G. Fütterer, M. Lano, N. Lindlein, J. Scwider, "Lateral Shearing Interferometer for Phase Shift Mask Measurement at 193 nm," Jul. 2002, Proceedings of SPIE, vol. 4691, Optical Microlithography XV, pp. 541-551.*

(Continued)

*Primary Examiner*—Mark F Huff
*Assistant Examiner*—Jonathan Jelsma
(74) *Attorney, Agent, or Firm*—Withrow & Terranova, P.L.L.C.

(57) ABSTRACT

The present invention presents three new classes of phase-shifting mask patterns. In optical image forming systems, a mask with phase shifted regions can act as a precision instrument for characterizing imaging. Three new classes of phase-shifting mask patterns have been invented to characterize projection printing tool illumination and phase-shifting mask (PSM) performance. The linear phase grating (LPG) and linear phase ring (LPR) both serve to characterize illumination angular distribution and uniformity. A third new class, the interferometric-probe monitor for phase-shifting masks (IPM-PSM), measures the effective phase, transmittance and edge effects of various phase-shifted mask features. All three patterns allow performance comparison across the field, tool-to-tool, over time, or to intended design.

5 Claims, 22 Drawing Sheets

OTHER PUBLICATIONS

McIntyre and Neureuther, "*Characterizing Illumination Angular Uniformity with Phase-Shifting Masks*", Optical Microlithography XVI. Edited by Yen, Anthony. Proceedings of the SPIE, vol. 5040, pp. 162-170 (Feb. 25, 2003).

McIntyre and Neureuther, "*Interferometric-Probe Monitors for Self-Diagnostics of Phase-Shifting Mask Performance*", 23rd Annual BACUS Symposium on Photomask Technology. Edited by Kimmel, Kurt R.; Staud, Wolfgang. Proceedings of the SPIE, vol. 5256, pp. 1324-1330 (Sep. 9, 2003).

McIntyre and Neureuther, "Linear Phase Ring Illumination Monitor", J. Vac. Sci. Tech, May 28, 2003.

Van Den Broeke, "Transferring Phase-Shifting Mask Technology into Mainstream Manufacturing", Downloaded from: http://www.semiconductorfabtech.com/features/lithography/articles/body5.225.php3 on Oct. 22, 2004, 7 pages.

* cited by examiner

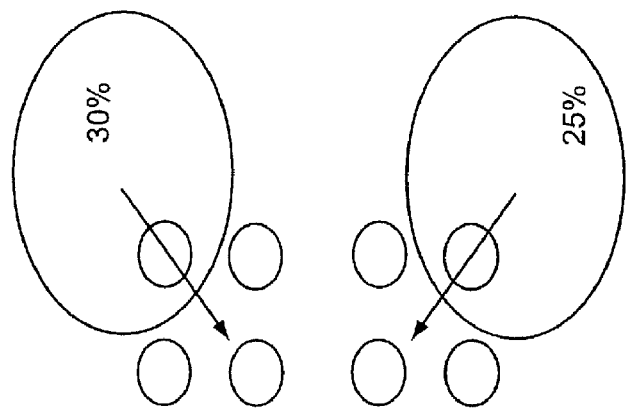
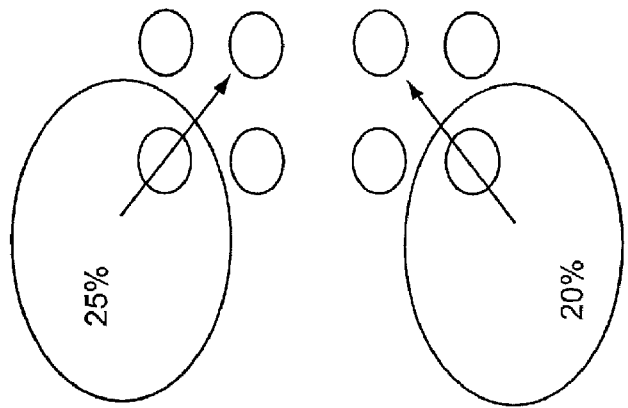
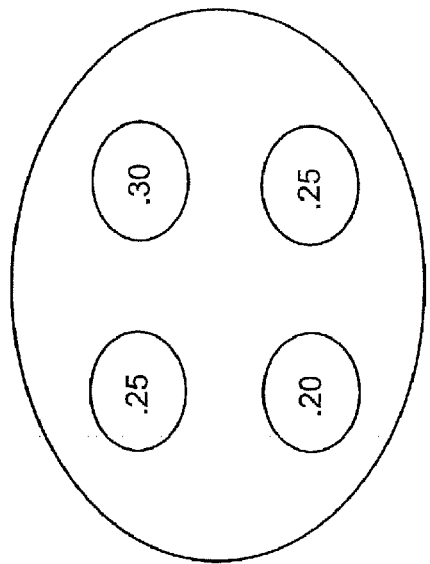
FIG. 6

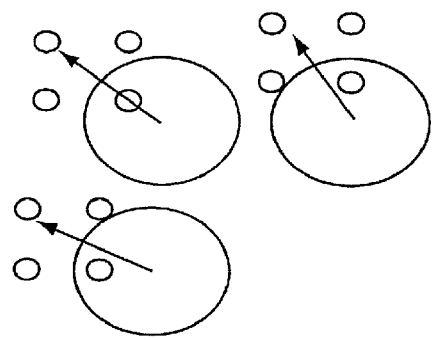
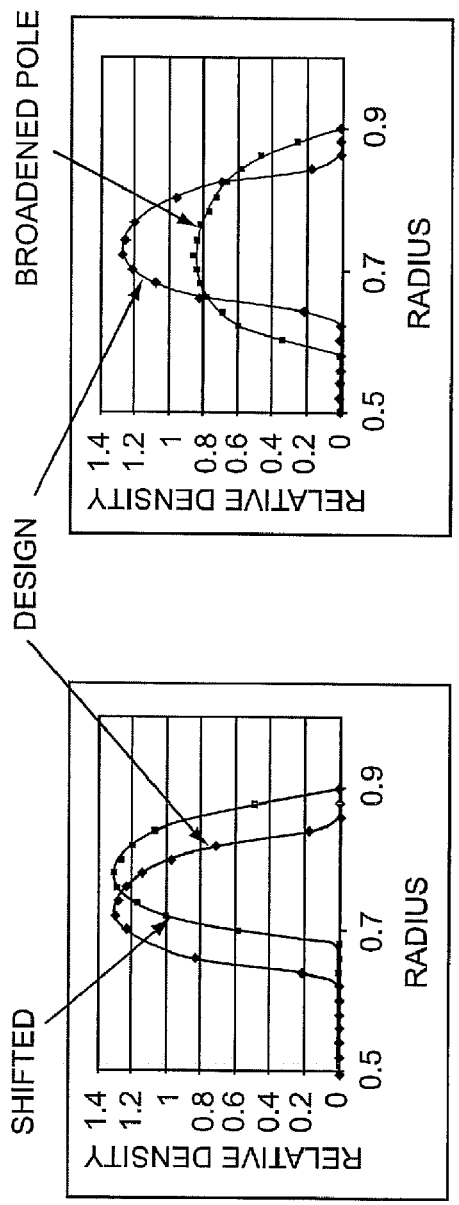
FIG. 7

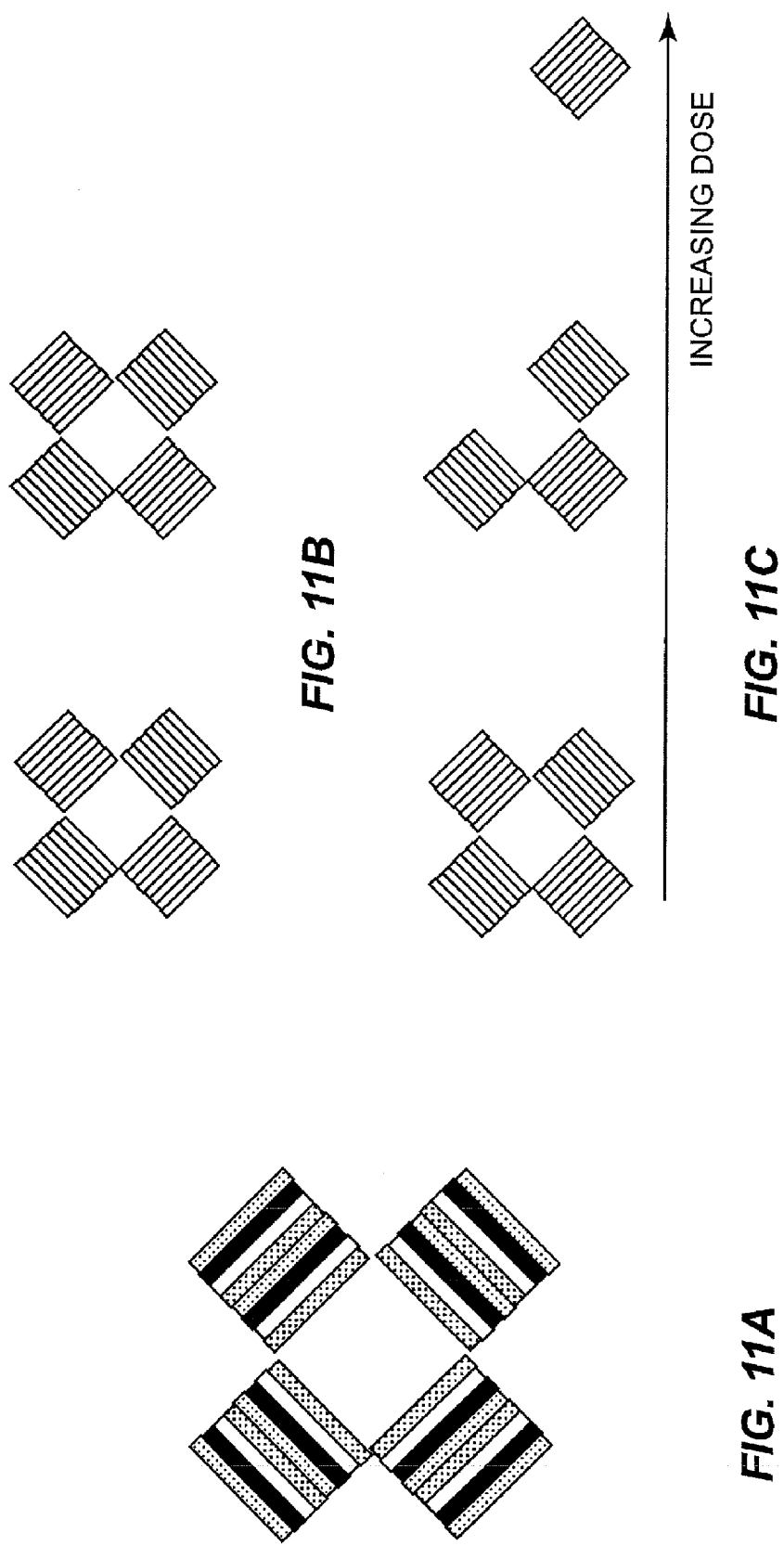

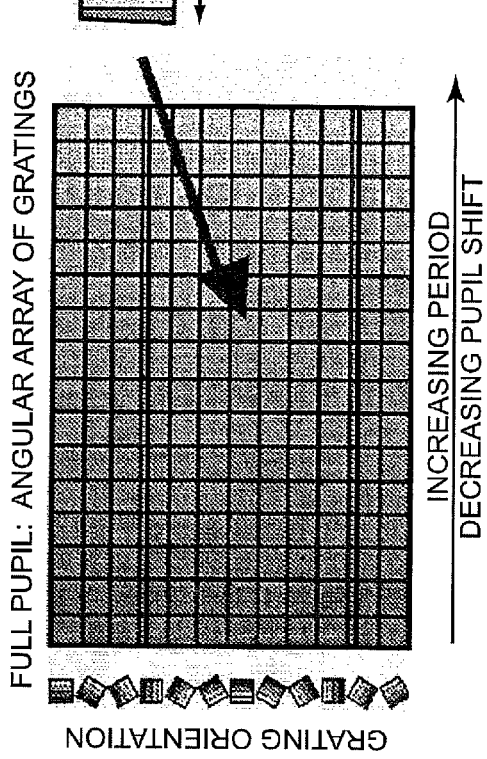
FIG. 12A
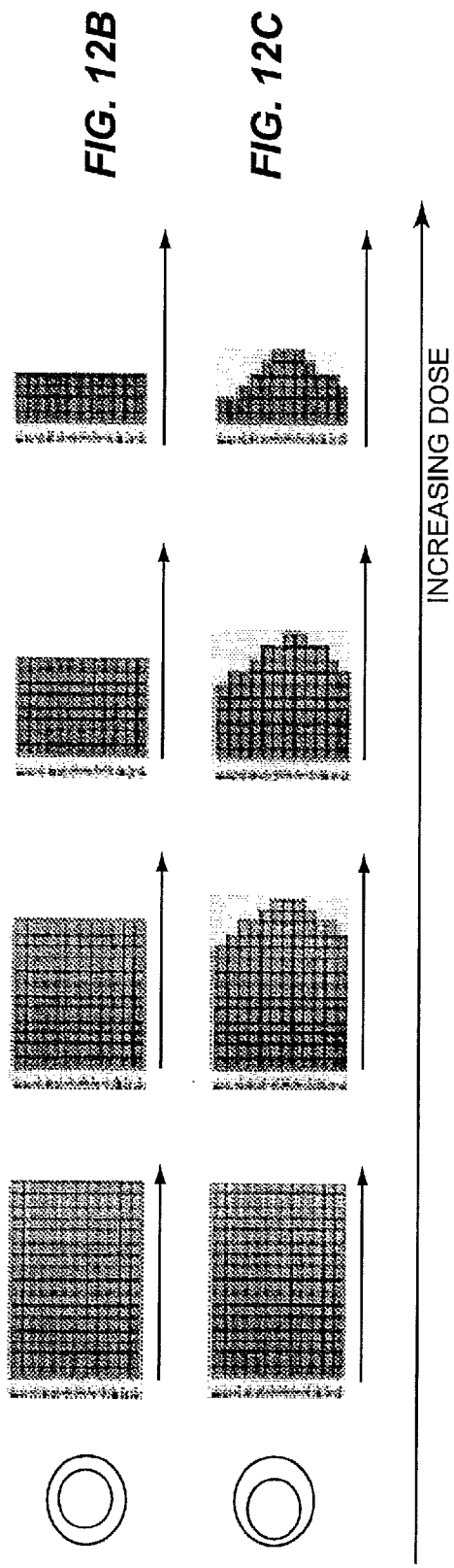
FIG. 12B
FIG. 12C

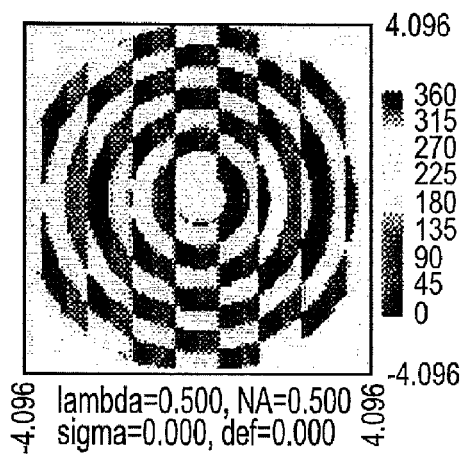 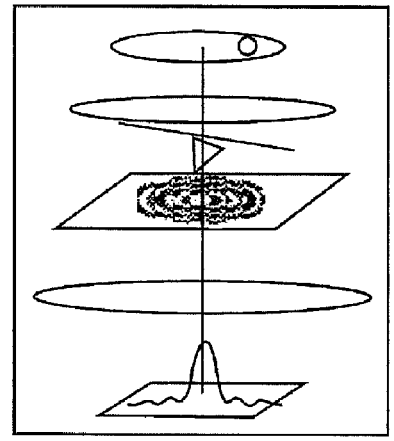
FIG. 16A  FIG. 16B
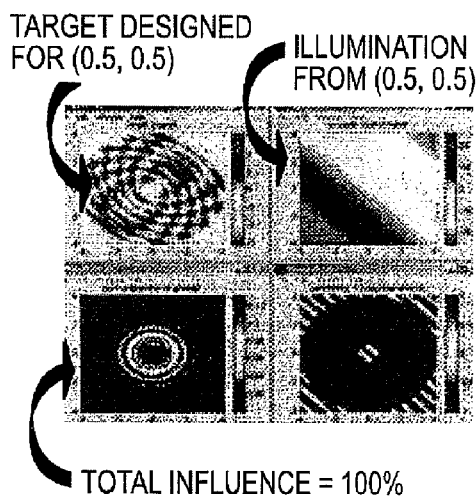 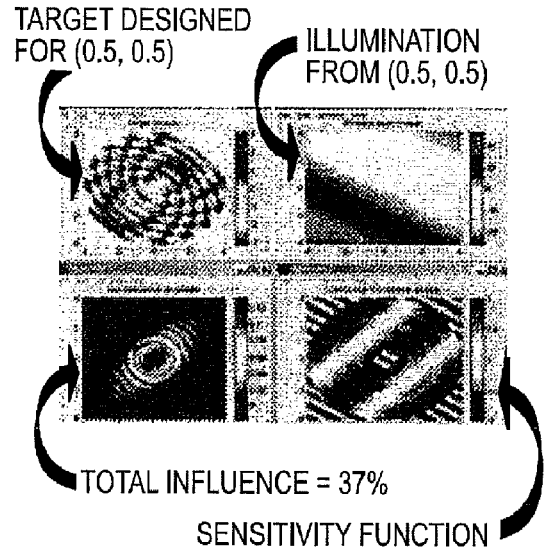
FIG. 16C  FIG. 16D

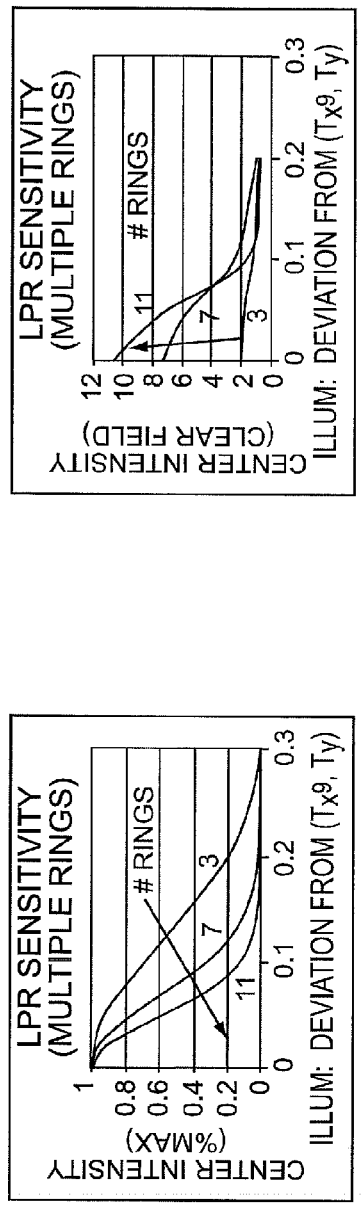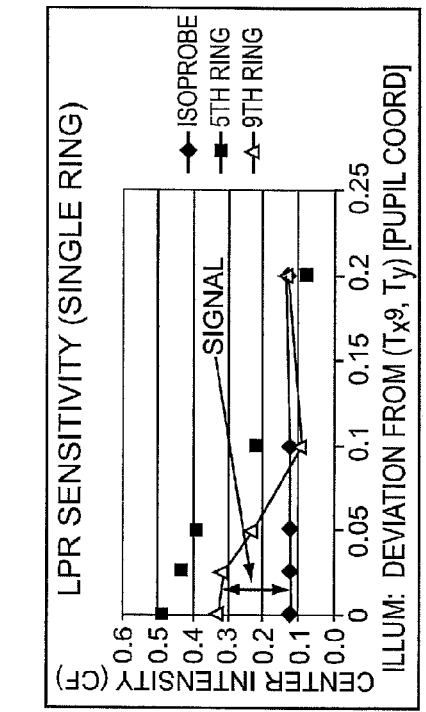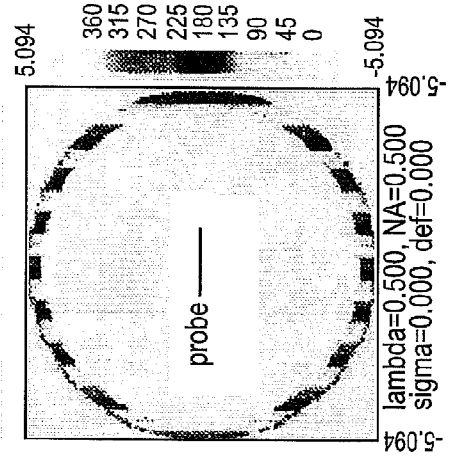
FIG. 17A
FIG. 17B
FIG. 17C
FIG. 17D

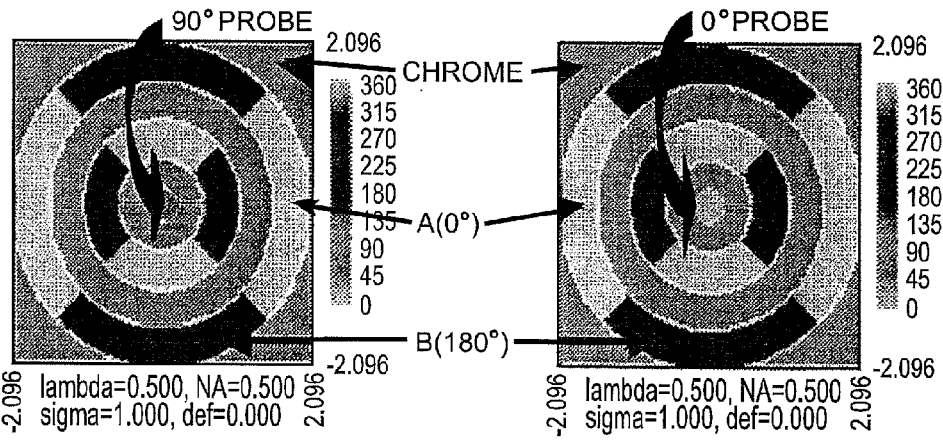
FIG. 22A  FIG. 22B
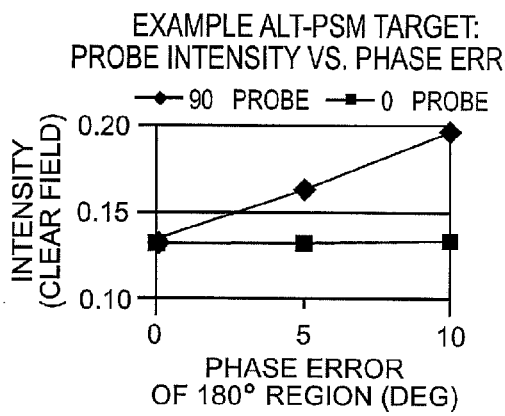
FIG. 22C
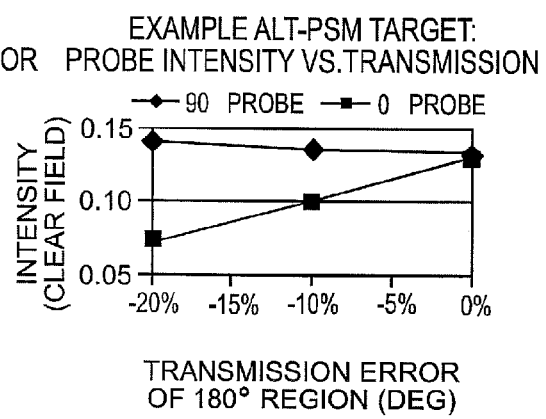
FIG. 22D

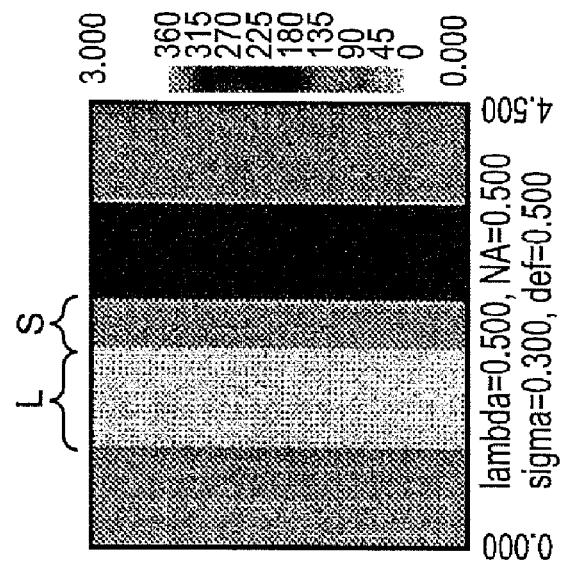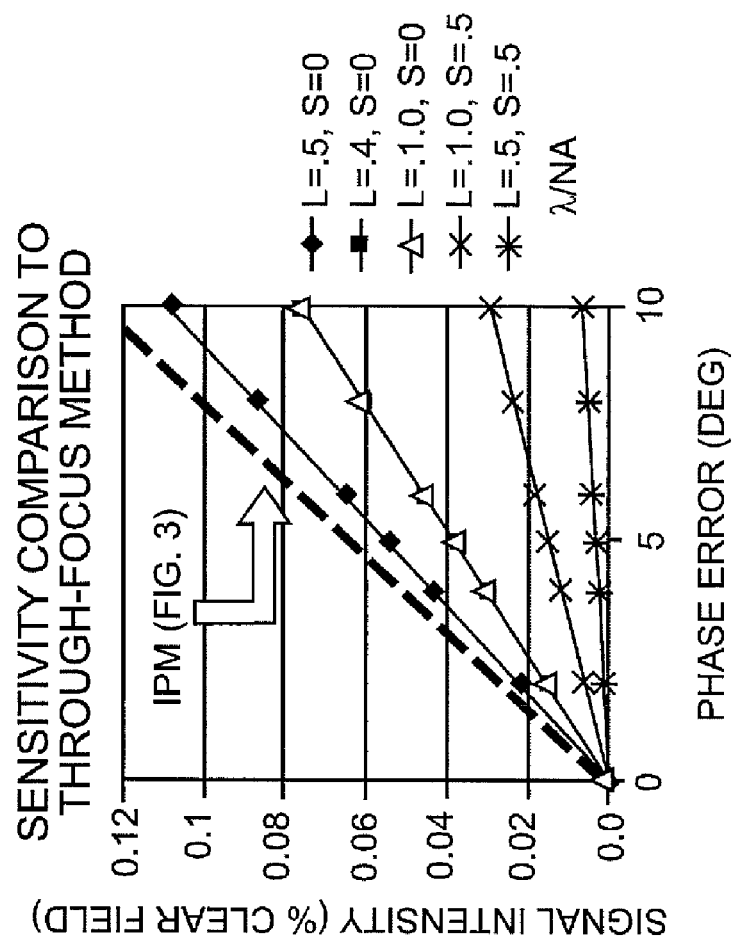
FIG. 29

PHASE SHIFTING TEST MASK PATTERNS FOR CHARACTERIZING ILLUMINATION AND MASK QUALITY IN IMAGE FORMING OPTICAL SYSTEMS

CROSS REFERENCE TO RELATED APPLICATIONS

This application claims priority under 35 U.S.C. §119(e) from provisional patent application Ser. No. 60/547,552, filed Feb. 24, 2004 which is incorporated herein by reference for all purposes.

U.S GOVERNMENT RIGHTS

The U.S. government has rights in the disclosed invention pursuant to DARPA grant MDA972-01-1-0021 to the University of California.

BACKGROUND OF THE INVENTION

This invention relates generally to image forming optical systems, and more particularly the invention relates to phase shifting test mask patterns for characterizing illumination and mark quality in such systems.

A phase shifting mask alters the phase of light passing through certain areas of a photo mask in order to utilize destructive interference to improve resolution and depth of focus in optical lithography. The semiconductor industry is now considering such masks for use in fabricating integrated circuits such as mega bit memory and microprocessors which contain millions of transistors.

The phase shifting mask and its use in an image forming optical system must be free of printable defects. To this end, a mask with phase shifted regions can act as a precision instrument for characterizing the imaging.

SUMMARY OF THE INVENTION

The present invention presents three new classes of phase-shifting mask patterns. In optical image forming systems, a mask with phase shifted regions can act as a precision instrument for characterizing imaging. Three new classes of phase-shifting mask patterns have been invented to characterize projection printing tool illumination and phase-shifting mask (PSM) performance. The linear phase grating (LPG) and linear phase ring (LPR) both serve to characterize illumination angular distribution and uniformity. A third new class, the interferometric-probe monitor for phase-shifting masks (IPM-PSM), measures the effective phase, transmittance and edge effects of various phase-shifted mask features. All three patterns allow performance comparison across the field, tool-to-tool, over time, or to intended design.

The LPG comprises successive phases etched linearly within a periodic grating in a chrome-less mask region. It monitors illumination by diffracting an incident plane wave into only the +1 and higher orders. The illumination is thus steered into and out of the pupil at an angle and axis determined by the period and orientation of the grating. Total intensity captured within the pupil is recorded in resist, allowing for a fast measurement of the intensity within a particular region of the pupil. The manner in which LPGs are arranged on the mask determines the type and accuracy of illumination measurement. For example, four LPGs with the same period can be simply oriented along different 45° diagonals. When exposed in resist, the dose at which each LPG prints reveals the total intensity from one quadrant of the pupil, allowing for a fast analysis of quadrupole intensity balance or source symmetry. Multiple LPGs with various periods and angular orientations enable full characterization of the pupil-fill. Source irregularity is evident by a cursory inspection of the printed resist. If desired, a more in-depth quantitative analysis is available with various source reconstruction algorithms or by comparing experiment to simulation.

The remaining two patterns, the LPR and IPM-PSM, are both based on the coherent proximity effect spillover of a surrounding pattern on a central position, which creates a signal sensitive to illumination state or mask quality. Depending on the application, a sub-printable, interferometric reference probe is often used to coherently interact with the pattern signal, increasing target sensitivity and better discriminating orthogonal components. Quantitative measurement consists only of determining the central position intensity, and can be done with either an aerial image measurement system (AIMS) tool or exposed photoresist in a projection-printing tool. Since both targets print at normal exposure levels with sufficient sensitivity, they may be included on product wafers to fingerprint the illumination and mask phase and transmittance behavior during production.

The LPR, another illumination measurement technique, is designed to detect light from only a particular circular region within the optical system's entrance pupil. The mask pattern, consisting of an Airy pattern multiplied by a linear phase progression corresponding to a particular illumination pupil position, serves to spill light coherently into the center position for only illumination from that designed target location. The LPR's signal level depends on the number of Airy rings used and the angular discrimination depends on the LPR diameter. For small illuminators, such as a dipole configuration, an interferometric probe can be used to coherently interact with the pattern signal to increase sensitivity. The LPR design is versatile, allowing characterization of many types of illuminators by simply altering the geometry of the mask pattern. For example, a small dipole illuminator is characterized with two targets, each with a central probe and only outer (9th-11th) Airy rings modified by the linear phase progression corresponding to an intended dipole location. Whereas a large quadrupole illumination scheme is measured with four targets consisting of a few inner rings (thus detecting a larger portion of the pupil), no probe (due to the unwanted large amount of incoherent additions) and four appropriate linear phase progressions. Simulation studies of a four-phase implementation have shown signal strength to be high (about ⅓ to ⅕ of the clear field intensity per ring, angular discrimination is good (about 30% of the clear field per 0.02 pupil shift for the dipole detector described above), and good orthogonality to aberrations.

The IPM-PSM, comprising a two-phased pattern and an interferometric-probe, is designed to self-diagnose phase-shifting mask (PSM) performance. The pattern is designed to coherently spill electric field into the center of the target if either a phase and/or transmission imbalance exists between the phase regions. Due to the orthogonality of phase and transmission errors, a sub-printable interferometric probe of either 0° or 90° phase allows amplification and detection of either type of error. Targets are designed with openings only in alternating rings of the Airy pattern (so coherent additions have the same sign) and such that there are equal openings of 0° and 180° phase at any given radius (so no electric field is spilled onto the probe if phase features behave correctly). The surrounding pattern consists of multiple copies of the same 0° and 180° pattern, and can consist of any feature type (including contacts) as long as it fits within an Airy ring. Actual mask performance is analyzed for that particular feature, to include the effects of real mask making errors and effective electromagnetic printing effects. Sensitivity of the monitor is related to the pattern size and can achieve greater than 1% of the clear field per 1° phase error with only a five-ring design (radius=3.1 l/NA) intended to measure phase trenches. Achievable sensitivity clearly outperforms existing measurement techniques since simply designing a larger pattern of features easily achieves more sensitivity. IPM-PSMs have been shown to be relatively insensitive to aberrations and probe manufacturing errors.

All three techniques described have been demonstrated for application to optical projection printing of integrated circuits through the standard computer simulation techniques used for engineering characterization in lithography. However, their concepts are suitable for monitoring and measuring image quality issues in a wide variety of imaging systems. The two illumination techniques (LPG, LPR) have potential applications in the following: inspection systems such as microscopes, linewidth measurement apparatus and telescopes; projection printing systems such as photocopiers and projection printers for integrated circuits; general electromagnetic imaging systems including infrared, optical communications systems, and radar; general wave systems including acoustic (inspection, sonar, surface wave devices); particle imaging systems due to dual nature of particles and waves; and biological vision systems including quantitative measurements of illumination uniformity and distribution incident on the retina (potentially as a diagnostic tool before and after refractive eye surgery). Other applications of the IPM-PSM may include analyzing phase-shifting devices used in any optical system such as telescope filters, adaptive optics deformable mirrors or MEMS arrays, EUV lithography multilayer stack mirrors, spatial light modulators, and any enabling device used for maskless lithography.

The invention and other objects and features thereof will be more readily apparent from the following detailed description and appended claims when taken with the drawings.

BRIEF DESCRIPTION OF THE DRAWINGS

FIG. 6 illustrates SPLAT simulation of how four LPGs each isolate and measure individual pole intensity in a single dose-to-clear measurement.

FIG. 7 illustrates multiple LPGs used to characterize angular distribution of pole intensity. Measured density profile for a particular shift axes (45° here) is compared to simulation of the intended design showing, for example, either a shifted or broadened pole.

FIG. 11 illustrates four LPGs oriented at the 45°'s serve to isolate and measure individual pole intensities. Comparison between how the (a) mask pattern prints in resist with increasing dose for (b) balanced and (c) unbalanced quadrupoles.

FIG. 12 illustrates angular array of linear phase gratings allowing for a full-pupil measurement of illumination distribution with the (a) mask pattern prints in resist in a manner representative of the illumination distribution and a comparison between a (b) symmetric top hat and an (c) asymmetric top hat.

FIG. 16 illustrates example LPR mask pattern (a) that is designed to detect an off-axis illumination ray from $(T_x, T_y)$ with (b) A plane wave originating from that design location is redirected and coherently spills into the center position, and the influence function and sensitivity are portrayed for illumination (c) from the target design location and (d) from another location.

FIG. 17 illustrates sensitivity curves are shown as a function of the number of LPR rings. (a) Relative intensity shows increasing sensitivity for larger targets and (b) absolute intensity shows very large signals with increasing ring count, and signal can be traded for sensitivity by using (c) a single ring target with an interferometric probe, and in (d) Sensitivity comparison of two single ring LPRs is shown, using an isolated probe as a reference.

FIG. 22 illustrates example targets for monitoring phase-trench performance in Alt-PSMs. 90° probe (a) is sensitive to phase error (c) while 0° probe (b) is sensitive to transmission error (d).

FIG. 29 illustrates many existing techniques rely on comparison of through-focused behavior to simulation, and sensitivity is feature dependent; comparison to a small 5 ring IPM (dotted line) is shown, and much greater IPM sensitivity is easily attained with more target rings.

DETAILED DESCRIPTION OF THE PREFERRED EMBODIMENTS

As noted above, a mask with phase shifted regions can act as a precision instrument for characterizing imaging. An advantage of this method lies in the fact that all of the information about the optical source is directly readable from photoresist on a single dose-matrix wafer. Due to mask simplicity, the method is particularly advantageous for monitoring quadrapole or quasar illumination schemes.

In accordance with the invention, three embodiments of phase shifting mask patterns are presented to characterize projection printing tool illumination and phase shifting mask (PSM) performance. There are linear phase grating (LPG), linear phase ring (LPR), and interferometric-probe monitor for phase-shifting masks (IPM-ISM), Following is a description of each embodiment.

Figure 1:
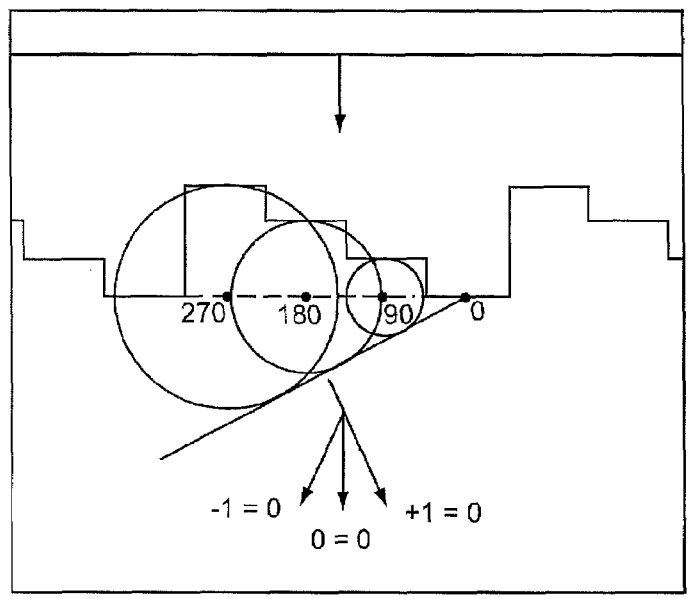
FIG. 1 illustrates order selection with the Linear Phase Grating (LPG).
Figure 2:
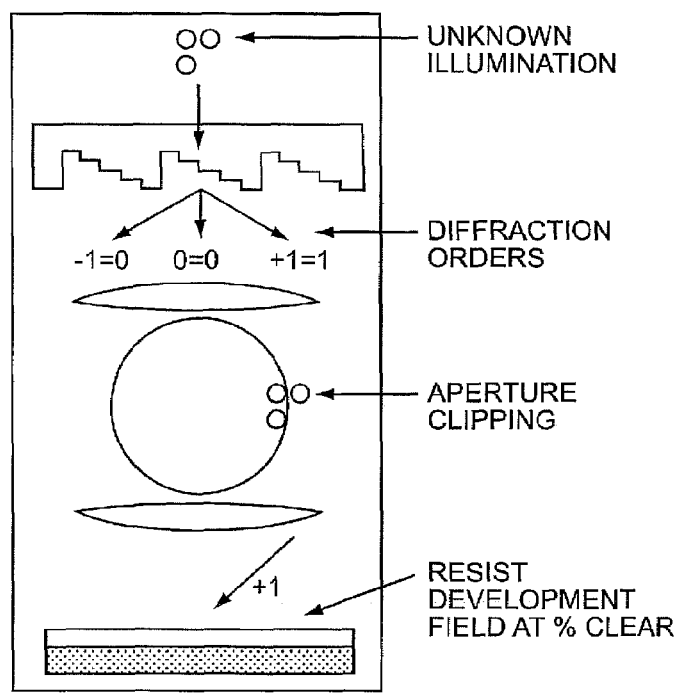
FIG. 2 illustrates how the pupil clips a portion of the +1 order, determined by the period of the LPG with captured intensity is recorded in the resist.

The concept of the linear phase grating (LPG) is relatively straightforward, as illustrated in FIG. 1. Successive phases, etched linearly in a chrome-less mask, serve to diffract an incident plane wave into only the +1 and higher orders. Notably, destructive interference from opposite and adjacent phases prevents radiation in the −1 or 0 orders. FIG. 2 shows the LPG directing the +1 order of the illumination into the pupil at an angle determined by the period of the grating. Thus, with an appropriate choice of the grating period, the pupil is used as an aperture to clip a certain portion of the illumination. The total intensity captured within the pupil is then recorded at the wafer plane via the clearing dose of the resist. We note that the measurement consists of simply determining whether or not the resist has cleared, since the incident radiation has only a single DC component.

The function of the LPG allows for two important measurements of the illumination pupil-fill. First, a single grating period, appropriately oriented on the mask, will serve to isolate and measure the total intensity in a particular region of the pupil. The usefulness of this concept will be illustrated in section 3.1 as a quick method to measure quadrupole intensity balance. Secondly, monitoring the angular distribution of the source is possible with the use of multiple LPGs.

Figure 3:
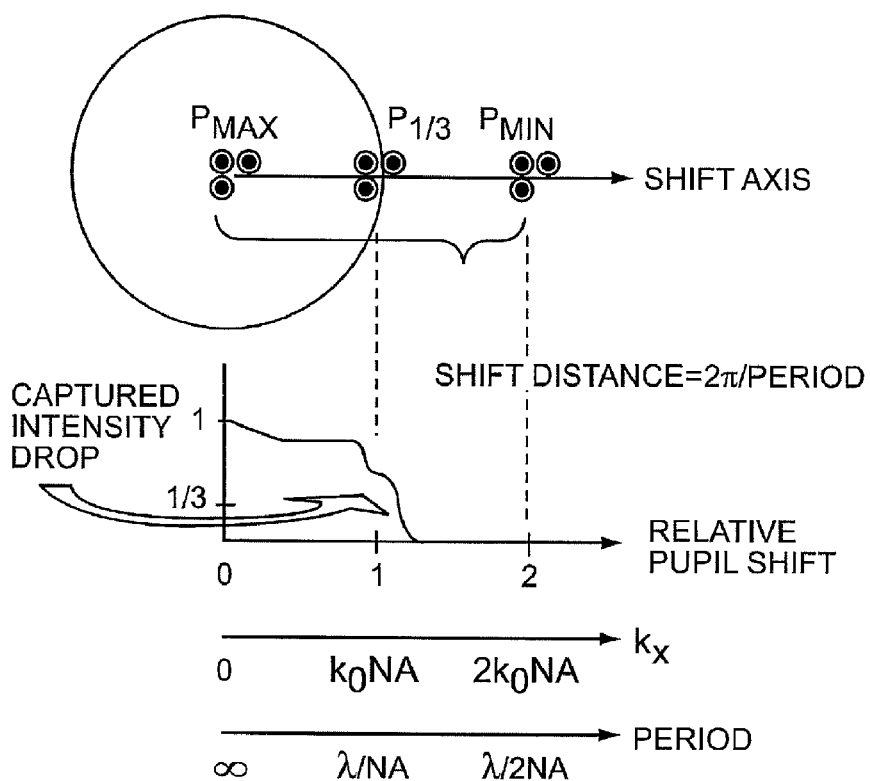
FIG. 3 illustrates captured intensity drop-off curve created at a specific shift axis by multiple linear phase gratings with varying period.

FIG. 3 illustrates how multiple LPGs are used to monitor the angular distribution of the illumination. As the grating period is decreased, the spatial frequency of the +1 order will increase, resulting in a greater shift within the pupil. Thus, multiple gratings with successively decreasing periods essentially 'walk' the illumination out of the pupil. With increasing pupil shift, the total intensity captured within the pupil declines. This information is recorded in resist and results in the 'captured intensity drop-off curve' (CIDOC) shown in FIG. 3. Furthermore, rotating the grating's orientation allows for the construct of multiple CIDOCs for various shift axes.

Figure 4:
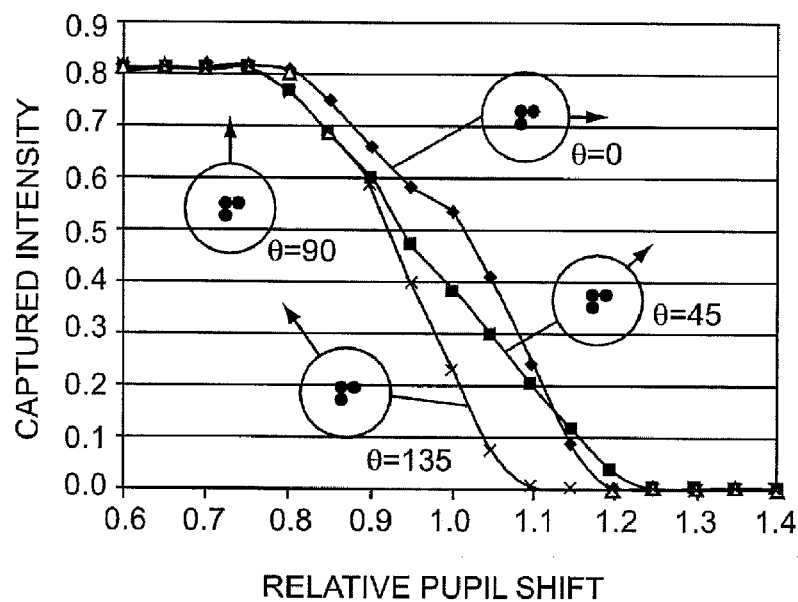
FIG. 4 illustrates simulation of a fictitious three-pole illuminator gives a series of captured intensity drop-off curves for multiple shit areas.
Figure 5:
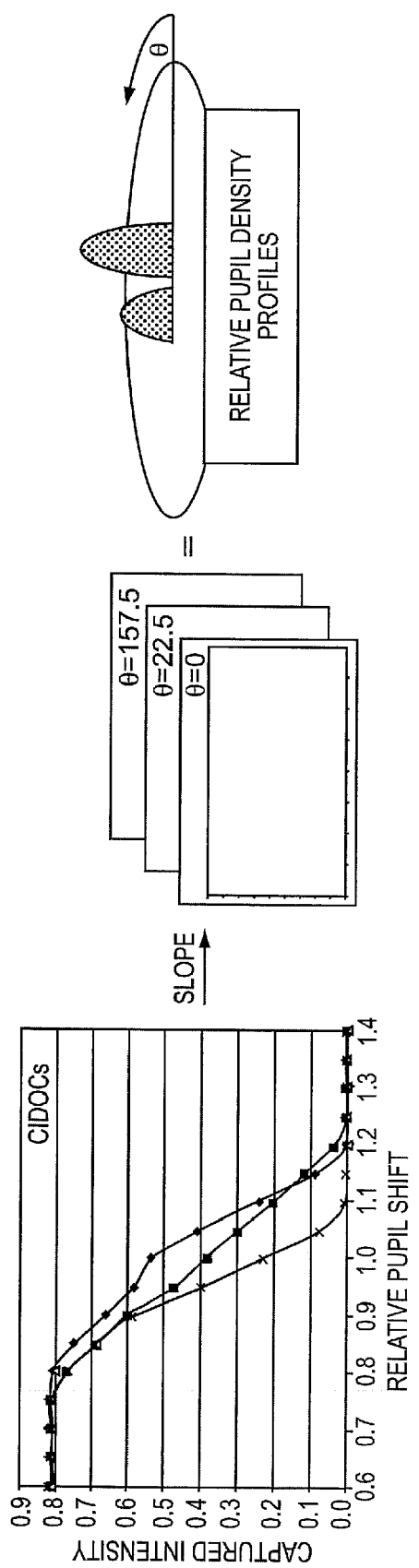
FIG. 5 illustrates differentiation of the captured intensity drop-off curve gives a pupil-fill density profile for a particular cut-line in the pupil.

Simulation of a fictitious three-pole illuminator clearly illustrates this principle in FIG. 4. By shifting the unorthodox illuminator out of the pupil at various angles, we obtain a series of CIDOCs. Analysis of these curves relays important information about the source and can be done in one of two ways. First, these curves can simply be compared to curves from other field locations, providing a fast, qualitative method to check for source symmetry. The simplicity of this concept will become clear in section 4, after discussion of how the mask pattern prints in resist with increasing dose. Alternatively, analyzing the rate at which these CIDOCs decline allows for a quantitative analysis of the angular distribution of the actual pupil-fill. As shown in FIG. 5, the slope of the CIDOC can be viewed as a 'pupil-fill density profile' for a particular cut-line in the pupil. Then, depending on the type of source to be measured and considering the circular geometry of the pupil, these profiles can be converted into a reconstruction of the source. Examples will be discussed in section 3. We also note that the presence of the 2nd diffracted order limits the minimum possible pupil shift. Thus, the minimum shift will depend on the angular extent of the illuminator under analysis.

A straightforward application of the LPG offers a quick analysis of a quadrupole or quasar illumination scheme. This section will first show how the LPG can quickly measure individual pole intensities. We will then discuss how to determine the angular distribution of that intensity.

With the appropriate choice of a single grating period, oriented at 45 degrees on the mask, the LPG directs the illumination such that only one pole is captured within the pupil. For comparison between poles, four gratings with appropriate orientations are used to isolate and measure each individual pole. A preview of FIG. 11b may provide the reader with a better picture of how this is accomplished. Thus, a single dose-to-clear measurement will reveal the total intensity of each pole with the following relationship:

$$\text{Pole intensity (in \% of total)} = \frac{\text{dose to clear (in \% clearfield)}}{0.81}$$

The denominator here refers to the total intensity in the −1, 0, and +1 orders for an ideal LPG. However, realistic fabrication of the mask would probably bring this closer to 0.75, which we discuss in section 5. Splat simulation confirms the direct correspondence between pole intensity and the total captured intensity within the pupil for the appropriate LPG, as seen in FIG. 6. Isolation of the poles with this technique provides not only a fast comparison between poles, but also a comparison of various locations across the field and/or tool-to-tool.

In addition to measuring the total pole intensity, multiple LPGs of varying periods are used to determine the angular distribution of that intensity. A series of LPGs, each oriented at 45 degrees and with decreasing periods, serve to 'walk' the illumination out of the pupil, as in FIG. 7. A density profile is extracted (slope of the CIDOC) and can simply be compared to simulation of the intended design. FIG. 7 shows two potential results of this analysis: the design compared to both a shifted source and a broadened source. Note also that a more detailed analysis is possible with additional shift angles, also displayed in FIG. 7.

Figure 8:
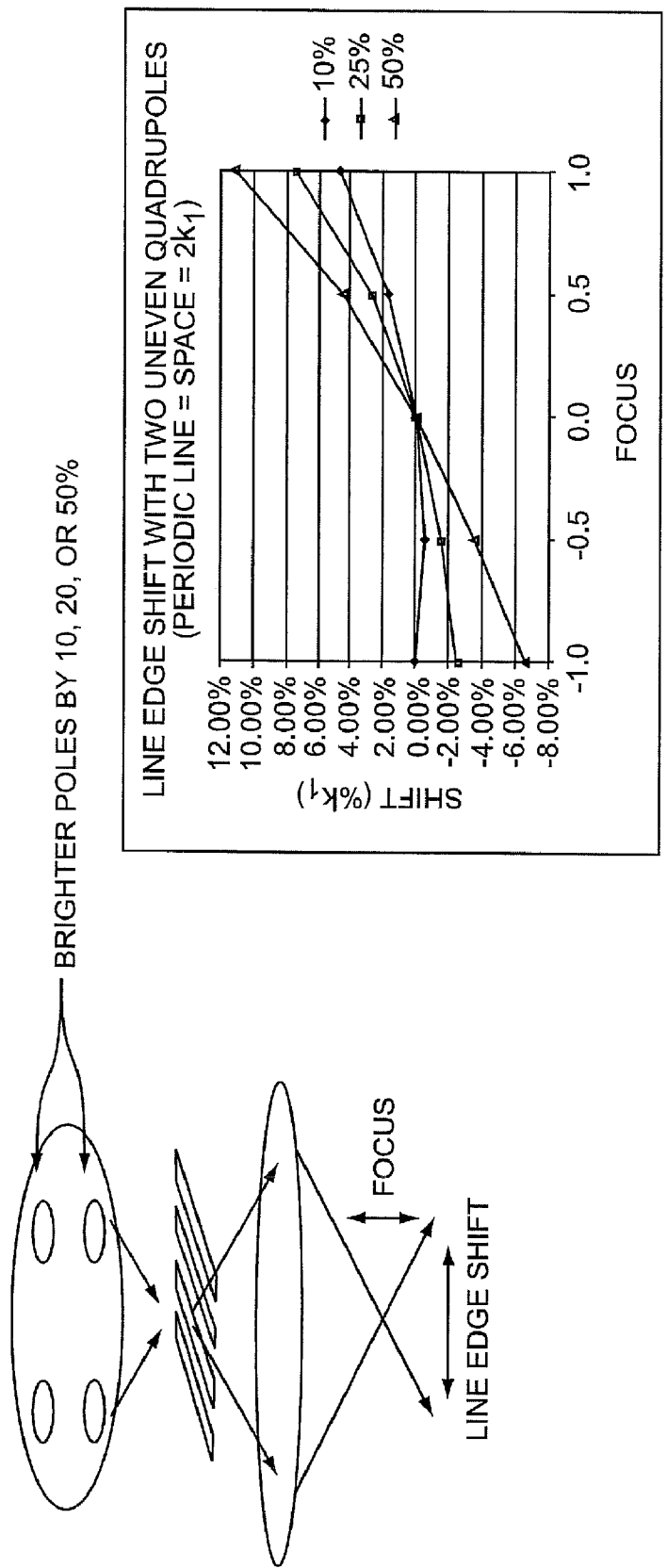
FIG. 8 illustrates potential focus dependent shift of feature placement due to unbalanced quadrupoles. Feature is line=space=$2 \times k_1$.

An example of why unbalanced quadrupoles would be undesirable is shown in FIG. 8. Here two of the poles are brighter than the other two by either 10, 20, or 50 percent and we are printing lines and spaces twice as large as the most dense features printable with this system. We note the loss of process latitude, seen as a focus-dependent shift of the feature placement. Thus, a line placement budget of 4% of the minimum feature size would require the poles to be balanced to within ±10%. Other consequences of improper illumination are shown in literature.

Depending on the size, complexity, and symmetry of an illumination scheme, a few possibilities exist as to how the LPG can measure or monitor the pupil-fill. Additionally, the test mask can be tailored to efficiently measure a particular illuminator. We will discuss here two techniques: measuring small, asymmetric pupil-fills and large, symmetric pupil-fills.

Figure 9:
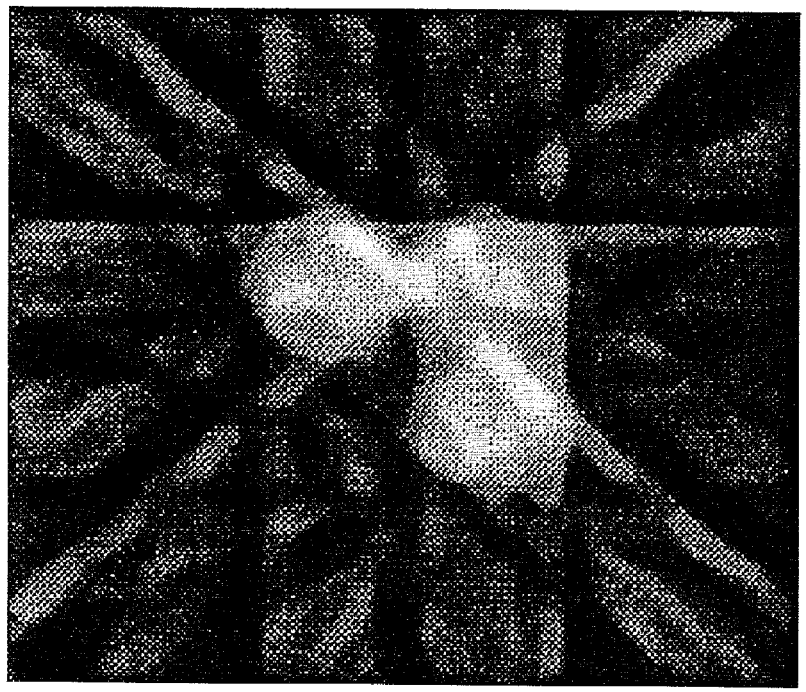
FIG. 9 illustrates parallel beam reconstruction of small three-pole illuminator from 8 shift angles and 0.05 pupil step. $R_{spot}$=0.1.

Should the illuminator in question be contained within a small central region of the pupil (less than sigma=0.5), the pupil edge can be approximated as a straight knife-edge. As discussed earlier, multiple LPGs serve to 'walk' the illumination out of the pupil at multiple angles to create a series of pupil-fill density profiles. The knife-edge approximation allows us to convert these density profiles into a reconstruction of the illumination angular distribution. Parallel beam reconstruction, a technique often used in medical imaging, does this by taking advantage of the Fourier slice theorem, which states, "the fourier transform of a parallel projection of an image f(x,y) taken at an angle q gives a slice of the two-dimensional transform, F(u,v), subtending an angle q with the u-axis." In other words, we take the Fourier Transform of the 1-D density profiles, back-project them onto a 2-D circular background, and then take the 2-D inverse Fourier transform to get the measured pupil-fill 7. The accuracy of this reconstruction is clearly dependent on the number of gratings used. Returning to the fictitious three-pole illuminator as an example, we show a reconstruction from eight angles and a pupil shift increment of 0.05 in FIG. 9.

Figure 10:
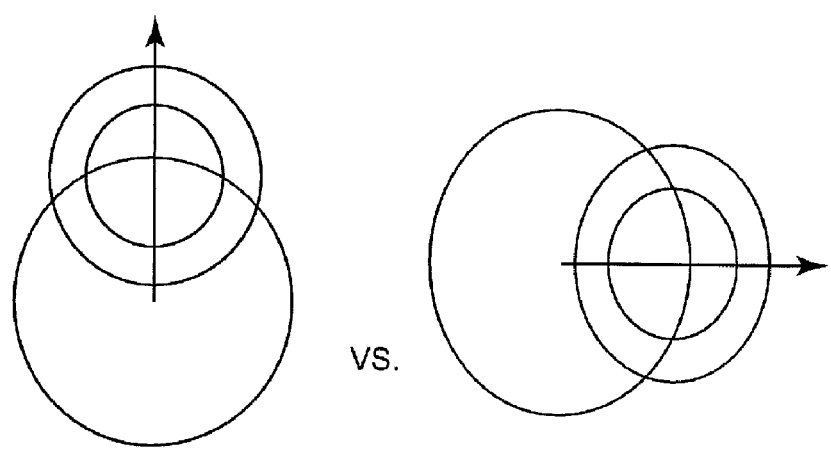
FIG. 10 illustrates quick check for source symmetry by comparing captured intensity drop off curves for various shift axes.

However, large, symmetric pupil-fills such as top hat or annular are more commonplace in lithography. Reconstruction of the entire source is possible, although the curved nature of the pupil makes matters more difficult. Perhaps a more useful application of the LPG is as a quick check for source symmetry. As in FIG. 10, we 'walk' the illumination out of the pupil at various angles and compare the resulting CIDOCs. If the source is truly uniform, these curves will be identical. However, asymmetry will result in a mismatch. The next section will show this simplicity more clearly in how the mask pattern clears the resist as we expose through dose.

The main advantage of this technique becomes apparent with discussion of how the mask pattern prints in resist in a simple dose-matrix. Returning to the measurement of quadrupole intensity, we offer the mask pattern shown in FIG. 11. Each of the four gratings consist of about 10 periods and are oriented such as to isolate and measure an individual pole. Assuming a positive resist, as we increase the dose the four gratings will all clear simultaneously if the poles are balanced. However, if the poles are unbalanced, each grating will clear at a different dose. That dose is directly proportional to the total intensity of that pole. Thus, a cursory inspection of a dose-matrix wafer with a low magnification optical microscope will determine if the poles are balanced. If they appear to be unbalanced, then the exact imbalance can be quantified by noting the dose at which each grating clears.

Extension of this technique to measure or monitor the full angular distribution of the pupil-fill requires multiple LPGs. In FIG. 12, we offer an angular array of LPGs as a mask pattern to accomplish this. Each square of the array contains approximately 10 periods of a particular grating. Horizontally, the grating periods are increased such as to cause less of a pupil shift. Vertically, the orientation of the gratings are rotated as to 'walk' the illumination out of the pupil at multiple angles. As with the quadrupole monitor, the manner in which this pattern prints clearly displays source symmetry or asymmetry. FIG. 12 compares how the pattern prints through dose for a symmetric and an asymmetric top-hat source. With a symmetric source, each grating of a particular period will clear at exactly the same dose, regardless of its angular orientation. This is a direct reflection of the 'captured intensity drop off curves' (CIDOCs) being identical for any shift angle. Conversely, an asymmetric source will lead to an asymmetric printing of the mask pattern through dose. The example in FIG. 12(c) is for a source slightly shifted to the left. However, the nature of any source asymmetry will be evident from the manner in which the pattern clears, again being analogous to mismatched CIDOCs.

Thus, in a single dose-matrix, a cursory inspection of the wafer will display signs of source irregularity. If those signs are present, the capability exists to take a closer look as to which dose caused each grating to print. That information allows us to construct the CIDOCs, as discussed earlier, offering a more detailed analysis of the pupil-fill. We note that all of the information about the source is directly readable from the single dose-matrix wafer. This offers a potential advantage over existing techniques. It avoids the need to build up a source contour from multiple digitized photographs, which would be integrated over to determine the pupil-fill's intensity distribution. The LPG period is related to the specifications of the system and the desired relative pupil shift as follows:

$$P = \frac{M\lambda}{\Delta r\, NA}$$

where Δr is the desired relative pupil shift and can range from 0.5 to 2.0, depending on the size of the illuminator under analysis. With FIG. 13 as a reference, we note that the maximum phase etch is about 1.5λ for a phase shift of 270 degrees. As an example, for a 248 nm system with an NA of 0.5 and magnification of 5, we find the following dimensions for both discussed mask designs:

TABLE 1

LPG Dimensions for (a) quadrupole monitor and (b) full pupil angular array of LPGs. Dimensions listed for a 248 nm system with NA = 0.5 and M = 5.

| (a) | | (b) | | |
|---|---|---|---|---|
| Δr | 1.3 | Δr | 2.0 | 0.5 |
| P (nm) | 1900 | P (nm) | 1240 | 4960 |
| P/4 (nm) | 480 | P/4 (nm) | 310 | 1240 |
| | | ΔP (nm) | 6 | 97 |

Although dimensions will vary from tool to tool, these numbers show the mask tolerance requirements to be feasible. We note that the increment between grating periods (ΔP) depends on the desired resolution of the measurement. The numbers reported here are for a very aggressive 0.01 pupil increment, which would offer a rather detailed analysis of the pupil-fill.

Figure 13:
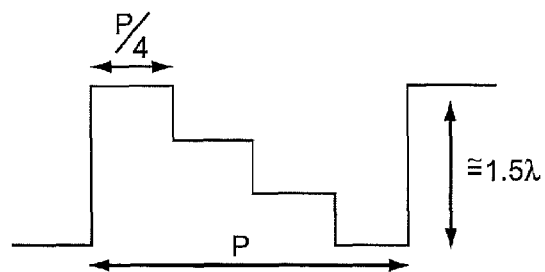
FIG. 13 illustrates LPG dimensions.
Figure 14:
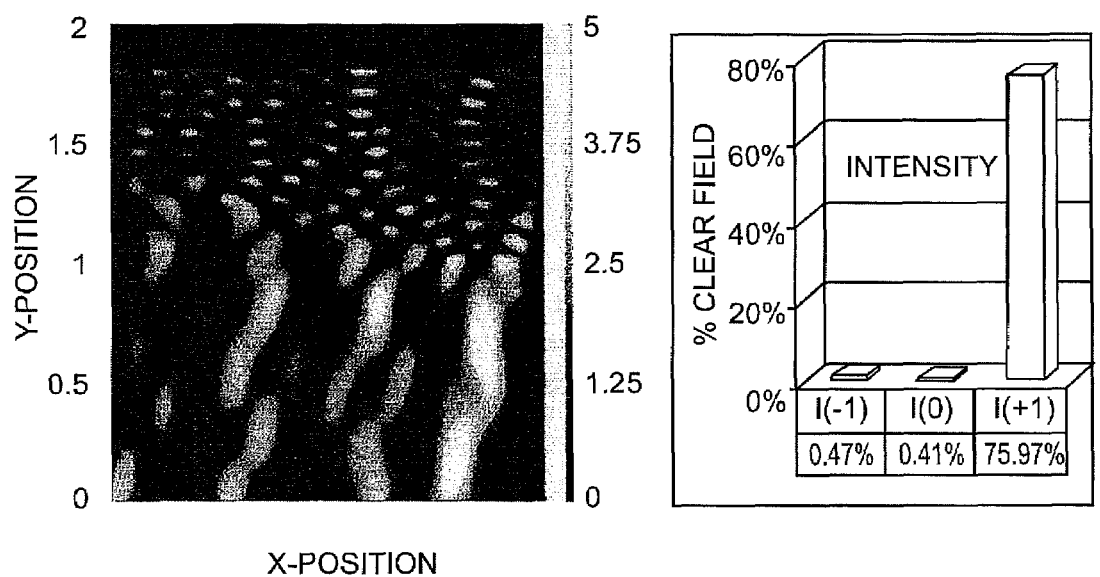
FIG. 14 illustrates TEMPEST near field simulation of LPG with geometry shown in FIG. 13 with a majority of energy is shown to be diffracted in the +1 order.

To test the electromagnetic performance of the LPG, we simulated the domain shown in FIG. 13 with TEMPEST and found the near fields shown in FIG. 14. Immediately obvious is the hot spot at the foot of the 0 degree phase ledge. This is clearly from the electric field coupling with the steep vertical sidewall between the 0 and 270 phase regions, and can be accurately predicted with Chenenkov radiation. However, the important issue is the energy diffracted in the −1, 0, and +1 orders, also shown in FIG. 14. Ideally, no radiation should occur in the 0 or −1 orders, causing zero contrast at the resist.

However, the vertical sidewall boundary conditions prevent the cancellation of the unwanted orders and result in a contrast at the resist of about 25%. This is only somewhat problematic, as we can still extract the required information by, for example, measuring with the dose at which the last of the resist clears. We also note that the total intensity of the −1, 0, and +1 orders is about 76%. This is in comparison to the 81% discussed earlier for the ideal one-dimensional LPG. Upon fabrication, the exact number could easily be calibrated.

Figure 15:
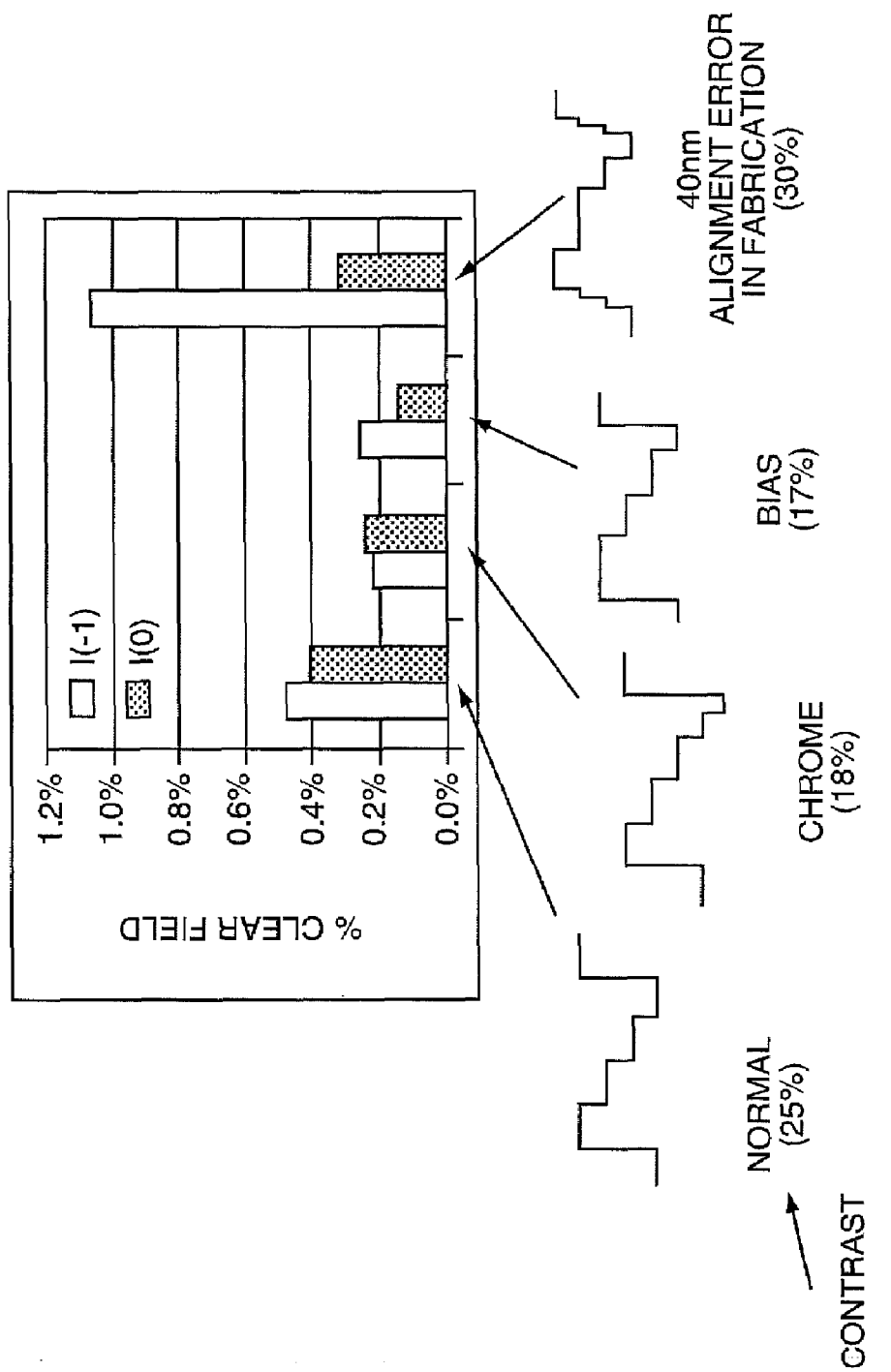
FIG. 15 illustrates how decreasing the unwanted (0, −1) orders and contrast is possible by adding chrome 0° phase ledge or by biasing the geometry.

Improvement of the LPG's performance is possible by altering the design and/or dimensions. Two examples, seen in FIG. 15, are to either add a small piece of chrome on the 0 degree phase ledge or bias the geometry of the grating itself. With these, we do indeed see a decrease in the unwanted orders and contrast at the wafer. We have not yet optimized the LPG's performance, rather just shown that improvement is possible. Additionally, we simulated the fourth domain shown in FIG. 15 as a potential worse case scenario, representing a 40 nm misalignment error in fabrication. Although the unwanted orders do increase, we feel a 30% contrast is low enough to maintain LPG functionality.

Thus, from a mask making perspective, the period of the LPG is most important since it determines the relative pupil shift. Less critical are the individual phase ledges, which determine the ratio of energy found in the diffracted orders. With these, we believe there to be reasonable room for error during fabrication.

A phase shifting mask pattern, the linear phase grating, has been introduced as a potential tool to measure or monitor illumination angular distribution. Its advantage over existing techniques lies in the fact that the analysis of the source has been transferred to the mask pattern. A cursory inspection of a single dose-matrix wafer with a low magnification optical microscope readily displays signs of source irregularity. If signs of irregularity are found, the capability exists for the user to complete a more in-depth analysis of the source intensity distribution. Illumination pupil-fill is easily monitored across the field, tool-to-tool, or over time, or can be compared to the intended design. Mask requirements and electromagnetic performance issues have been discussed. With a grating period averaging about 2 mm, we conclude that fabrication appears feasible.

The linear phase ring (LPR) provides a new technique to monitor illumination based on coherent spillover at a central target position from surrounding concentric rings. To account for the linear phase variation from a given off-axis position, a complimentary linear phase variation is introduced in the design of the LPR illumination monitors. For analysis of certain small illuminators, a sub-printable, interferometric probe placed at the LPR center increases signal strength and sensitivity. LPR operation is similar in principle to receiving a signal with a circular aperture antenna, except that the summation is weighted by the proximity spillover. The key issues are signal strength, angular discrimination, and orthogonality to aberrations. The advantage of this technique is that analysis of the illuminator has been transferred to the mask pattern. Each LPR is designed to analyze only a single illumination frequency incident on the mask, allowing a fast and easy measurement of illumination schemes such as quadrupole and dipole. The measurement only consists of determining intensity at the center of the LPR. Furthermore, the LPR can be used on a special test mask or embedded in the scribe line of an actual production mask layout, although cost may be an issue.

Due to the circular nature of the lenses in a lithographic imaging system, an arbitrary clear field location B in the object plane (reticle) will contribute electric field to any other arbitrary location C in the image plane (wafer) dependent on the magnitude and phase of the point spread function centered on point B. This is commonly known as the proximity effect. By reciprocity, we can say that the influence on point C by any and all mask locations is simply the point spread function centered on point C. Thus, if a pattern that resembles the phase of an Airy pattern (a series of concentric rings of alternating 0 and 180 phase) is placed on the mask, a plane wave normally incident on the mask will spill electric field coherently into the center of the pattern. In other words, this two-phase mask pattern will act as a detector for an illumination spot in the center of the pupil. Illumination from any location not near the pupil center is not "spilled" into the center.

This mask pattern can be altered to detect an illumination ray from any location in the pupil. First, the Airy function is multiplied by a constant linear phase corresponding to the desired target location. The LPR mask pattern is then realized as the phase of this expression, as follows:

$$\Phi_{LPR}(x, y) = \text{Phase}\left[\text{Airy}(x, y) \times e^{+j\varphi_{target}(x,y)}\right]$$

$$\varphi_{target}(x, y) = \frac{2\pi T_x}{\lambda/NA}x + \frac{2\pi T_y}{\lambda/NA}y$$

An example mask pattern, shown in FIG. 16a, becomes a detector for an illumination ray located at position (Tx, Ty) in the pupil, normalized to the numerical aperture (NA) of the projection lens. The ideal phase distribution has been rounded to the nearest 90° to comply with conventional mask making capabilities. However, a test mask with finer phase steps might also be directly written with an electron beam in a resist system such as HSQ, potentially offering a very cost effective method to fabricate LPRs and other PSM test structures. FIG. 16b shows how an incident plane wave from the target design illumination location is redirected to coherently spill electric field into the center position. The intensity in the center position will achieve a maximum when an illumination ray coincides with the target design (Tx, Ty) and will decrease with increasing angular deviation from that location.

Since the linear phase variation for each illumination pupil position is unique, an LPR designed for a certain illumination location will be orthogonal to all other pupil locations. Furthermore, the mask design will generally be orthogonal to Zernike polynomials and will be unaffected by lens aberrations. However, we note that in some single-ring applications the LPR will be sensitive to rotationally symmetric aberrations such as defocus.

In order to design the LPR for a particular application, we first develop a theory for the sensitivity of the pattern to the incident illumination. Sensitivity is defined as the change in center intensity (from the maximum) as the actual illumination ray (from sx, sy) deviates from target design (Tx, Ty). The proximity effect spillover from any location B to the center of the pattern is found by considering at location B the magnitude and phase of the Airy function (centered at C), the phase of the incident illumination (Fillum(B)), and the phase change induced by the LPR (FLPR(B)) as follows:

$$E_{B\to C} = \text{Airy}(B) \times e^{j\Phi_{illum}(B)} \times e^{-j\Phi_{LPR}(B)}$$

$$\Phi_{illum}(B) = \frac{2\pi\sigma_x}{\lambda/NA}x_B + \frac{2\pi\sigma_y}{\lambda/NA}y_B$$

This will, in general, be a complex number. However, since the lens system is real, to determine the influence of the entire target on the center position, we simply take the real part of this function integrated over the LPR area:

$$E_C = \int_{LPR} \text{Airy}(x, y) \times \cos[\Phi_{illum}(x, y) - \Phi_{LPR}(x, y)]$$

The main point of interest here is that the LPR's sensitivity is only a function of the difference between the actual illumination ($\sigma_x$, $\sigma_y$) and the target design ($T_x$, $T_y$), as well as the number of rings in the LPR.

To gain a visual understanding of the above relations, FIGS. 16c and 16d show how a target behaves differently for illumination from different locations. The top left portion of both Figures is an ideal LPR designed for illumination with coordinates (Tx=0.5, Ty=0.5). The top right portion shows the phase variation across the mask for actual illumination from two locations (FIG. 1c: sx=0.5, sy=0.5; FIG. 1d: sx=0.4, sy=0.6). The difference between these two scenarios is seen clearly in the bottom left portion of the figures as the total influence. This influence function is a representation of the amount of electric field that would coherently spill into the center position from each location in the target. Thus, integrating over this function will determine the relative coherent spillover of the LPR. We see that illumination from the target design location (FIG. 16c) results in 100% of the maximum influence, whereas illumination from the alternate location contributes only 37% of the maximum. These numbers refer to the electric field at the center position and the expected measured intensity is simply the square of the electric field.

To gain a better understanding of how sensitivity depends on LPR design, we consider the electric field contribution to the center position ring by ring. The above relation can be rewritten as follows to show the influence of each ring:

$$E_A = \sum_N \frac{2}{\pi}\left(.5\frac{\lambda}{NA}\right)(2\pi r_N)\frac{J_1(2\pi r_N)}{(2\pi r_N)} \int_{N^{th}ring} \cos[\Phi_{illum}(x, y) - \Phi_{LPR}(x, y)]$$

The first part of the expression is the maximum electric field contribution from the Nth ring, or the total area under that ring of the Airy pattern. The second part is the sensitivity function. A plot of this function reveals the LPR sensitivity as a function of total rings, and is shown is FIG. 17. We see in FIG. 17a that the relative sensitivity increases with the use of more rings. However, the total intensity at the center location (FIG. 17b) also increases, resulting in a huge signal of about 10 times the clear field for an LPR with all 11 rings.

Improvement in sensitivity at the expense of the excess signal is attained by simply eliminating some of the inside target rings. Furthermore, the addition of a probe, a small sub-printable feature at the center of the mask pattern, can allow for improved sensitivity due to the coherent addition of the electric field from both pattern and probe. For a single ray of illumination, the intensity in the center position becomes: $I_C=(E_{probe}+E_{pattern})^2$ and the gain due to the presence of the probe is: Gain=2 ($E_{probe}/E_{pattern}$).

However, the use of the probe has both advantages and disadvantages, and is useful only when the size of the illuminator under analysis is fairly small. For a small illumination spot resulting in a single illumination ray, the use of a probe and hollow pattern has both increased angular discrimination and signal detection. FIG. 17c shows an example of an LPR with a probe and only the 9$^{th}$ ring. Sensitivity of this one ring LPR with probe is compared to an LPR consisting of only a 5$^{th}$ ring and probe in FIG. 17d. The signal in this case becomes the center intensity from both pattern and probe compared to the intensity of a nearby identical, but isolated, probe. Isoprobe intensity is shown in FIG. 17d as a straight line, constant with angular deviation. Larger ring radius results in better angular discrimination, which is also evident mathematically by the expression above as increasing ring number (N) is considered. For single ring targets with a probe, the resolution of the LPR is approximately inversely proportional to the size, and is given in pupil coordinates roughly as 0.5/ ring number.

The disadvantage of the probe appears when the illuminator under analysis is large. For example, if two small dipoles are considered, the pole from a location different than the target design will contribute electric field to the center position through the probe, but not the pattern. Thus, illumination from any other location will add an incoherent, noisy probe contribution as follows: $I_C=(N-1)I_{probe} +(E_{probe}+E_{pattern})^2$, where N−1 is the number of rays from locations other than the target design. Clearly, the incoherent probe contributions begin to drown out the pattern signal as the illuminator size increases and the probe becomes ineffective. Thus, a probe should only be used for small illuminators. Since a probe is not used for large illuminators, no incoherent noisy contributions to the center intensity exist from rays other than from the target design. Therefore illumination from other locations will not effect the measurement when no probe is used.

Figure 18A:
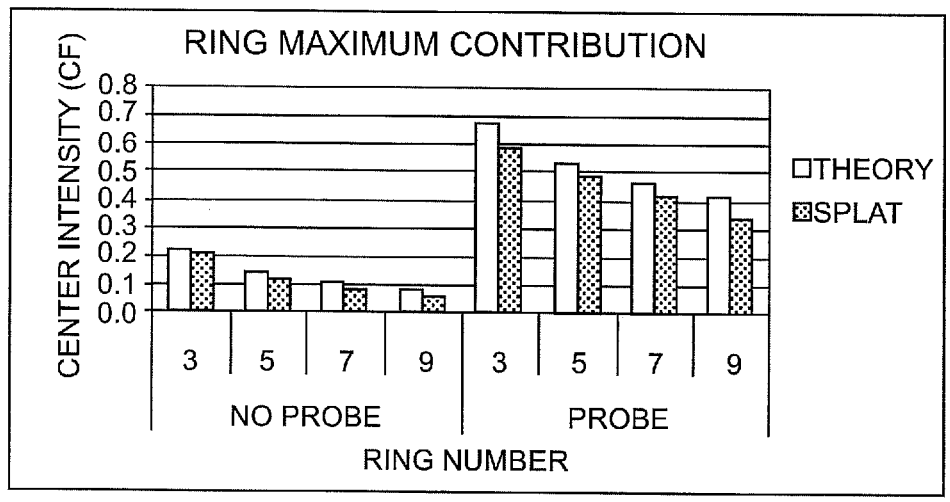
FIG. 18 illustrates theoretical (a) maximum single ring contribution and (b) sensitivity are compared to SPLAT simulation.
Figure 18B:
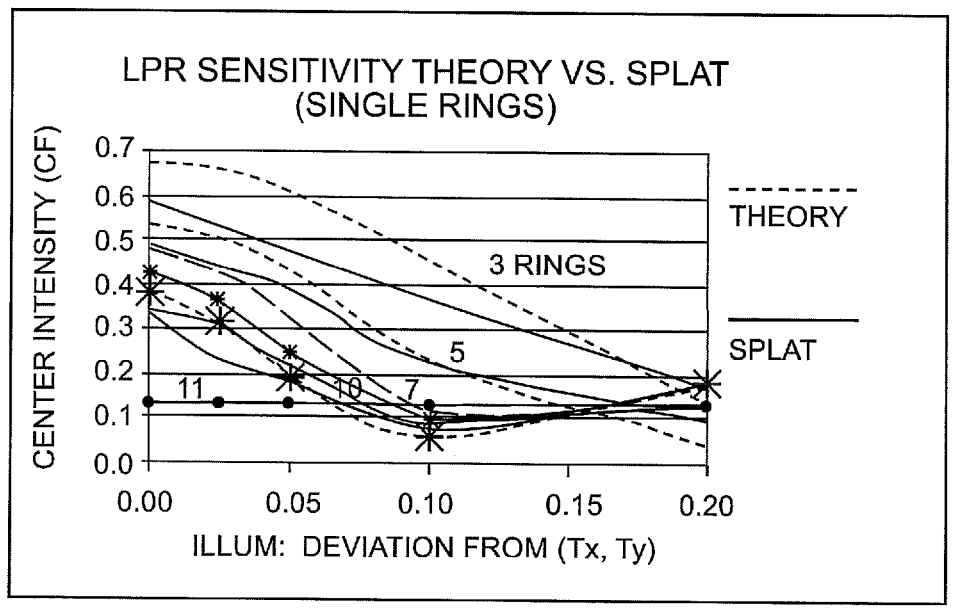

To determine the validity of our proximity effect theory of target sensitivity, we compare the theory for a single ring pattern with and without the probe to SPLAT simulation in FIG. 18. With a single ray illuminator, the maximum ring contribution is shown in FIG. 18a and the LPR's behavior through illumination pupil shift is displayed in FIG. 18b. We see that, although relatively accurate, the theory always predicts a higher intensity than is seen in simulation. This is likely due to the assumed sinusoidal shape (factor of 2/π) in the theory and the fact that the SPLAT input files used were generated from a rectangle-fitting algorithm. Finally, for a target designed for off-axis illumination, the obliquity factor may decrease the actual amount of energy incident on the mask.

The theory developed for target sensitivity clearly shows a trade-off between angular discrimination, signal strength, the number of target rings, the probe size (if any), mask complexity, and the physical extent and location of the illuminator under analysis. Thus, optimization of these parameters must be considered in designing a monitor for a particular application. As an example, we consider a dipole illuminator with relatively small spot sizes ($r_{spot}=0.1$) and look at two methods in which these targets may be implemented.

Figure 19B:
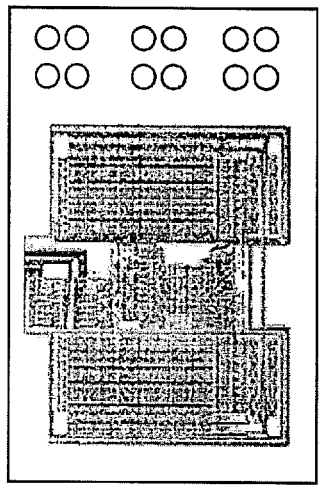
FIG. 19 illustrates LPR applications including (a) A dipole illuminator can be monitored with two mask patterns on a special test mask or (b) in the scribe line of a production mask layout with flexibility in LPR design allows measurement of other illumination schemes, such as (c) quadrupole or (d) an arbitrary full-pupil illuminator.
Figure 19D:
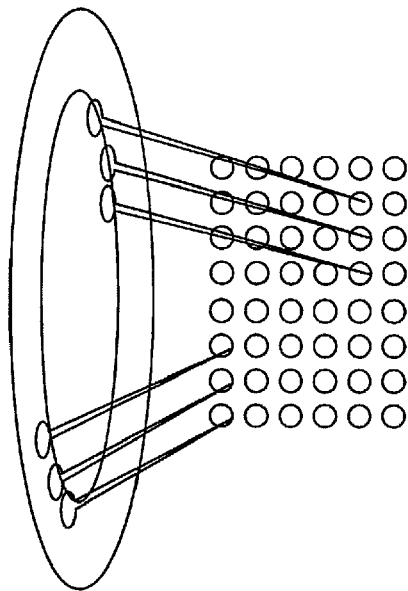
Figure 19A:
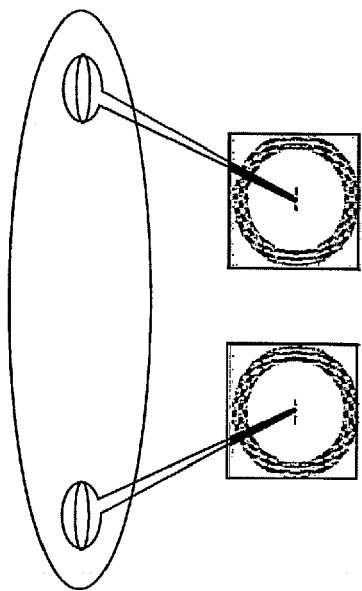

First, FIG. 19a shows how two LPRs can be used on a special test mask, each pattern optimized for one dipole. The relatively small nature of the dipoles allows for the use of a probe to increase signal sensitivity. Additionally, a target with only the 9$^{th}$, 10$^{th}$, and 11$^{th}$ rings allows for a reasonable pattern to probe signal ratio, while attaining excellent angular discrimination. The mask would be exposed through dose in photoresist. Simple observation of the resist pattern with an optical microscope, or perhaps with an automated CD-SEM, allows for comparison between both poles of the dipole. If both center positions cross the resist exposure threshold and print at the same dose, then the dipoles are balanced. However, if one LPR center prints before the other, then the dipoles are unbalanced by an amount quantified by the two clearing doses.

Secondly, these targets could be placed in the scribe line of a production mask layout and referred to during manufacturing if an error in illumination is suspected. For example, FIG. 19b shows multiple sets of two LPRs placed in the scribe line. Among the different sets would be a range of pattern and probe (if needed) designs offering varying signal strength. Thus, if the dipoles are indeed unbalanced, there will likely be a set of targets where one probe prints, but the other does not. This ability to monitor the state of illumination during manufacturing is unique to this technique, although the manufacturing cost associated with four phases may be an issue.

Figure 19C:
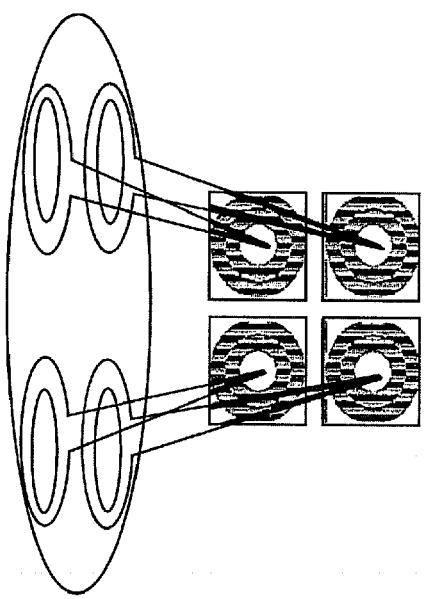

Other types of illumination conditions may be measured simply by altering the LPR design. For example, quasar illumination or quadrupoles similar those seen in FIG. 19c can be characterized on a test mask with four targets. Due to the larger extent of the poles a probe is likely ineffective due to excess incoherent contributions it would provide. Furthermore, a high degree of angular selectivity is not desired since each target is intended to detect a relatively large portion of the pupil. Thus, targets with only the $2^{nd}$ and $3^{rd}$ rings and no probe might be most effective. Again, this test mask would be exposed through exposure dose and the doses at which the center positions print are compared. In a balanced quadrupole, all four locations should print at the same dose.

Furthermore, arranging a large number of LPRs on a mask, as shown in FIG. 19d, will allow for a more general pupil characterization. Depending on the desired resolution, each target would be appropriately designed to be sensitive only to a particular region of the pupil. As an example, the signal from a target consisting of only the $9^{th}$, $10^{th}$, and $11^{th}$ rings (no probe) will decrease 30% of the clear field for a pupil shift of only 0.02. Thus each LPR responds only to intensity in a certain small pupil location, quantified by the dose at which its center prints. Analysis of a large number of appropriately designed LPRs provides a means to measure the full pupil-fill. However, this LPR application potentially adds cost and mask complexity and would generally not have an advantage over existing techniques.

As the relationship between LPR target geometry and angular discrimination should be clear at this point, we make an analogy to the directional gain achieved by an array of antennas. Just as multiple antennas, arranged appropriately in three-dimensional space, allow for detection of a signal from a smaller solid angle, rings of increasing radius allow for discrimination of illumination between smaller source spots.

Furthermore, a test mask with appropriate LPR designs could be used in conjunction with the pinhole camera technique to identify the absolute energy in a particular portion of the lens. By requiring overexposing the out-of-focus pinholes by up to 100 times the clear field dose, the pinhole-camera technique is often useful only for comparing relative intensities for various pupil locations. The LPR, however, allows for easier measurement of absolute local intensities in a particular pupil location at realistic operational doses. A combination of multiple techniques (pinhole camera, grating pinholes, linear phase gratings, and linear phase rings) will likely give the most accurate measurement.

A final application, based on a variation of the LPR, is to measure the degree of temporal coherence between two pupil locations. Ideally in Kohler illumination, all source points are completely temporally incoherent. This if often achieved by routing a coherent light beam (for example, from a KrF pulsed laser) through a diffuser and light pipe. However, it may be of interest if the diffuser and light pipe fail to completely randomize the light incident on a mask pattern. This could result in unwanted ringing in the aerial image and degrade feature printability.

The LPR was designed by taking the phase of the Airy pattern, multiplied by a linear phase associated with one pupil location. However, if the LPR design is the phase of an Airy pattern multiplied by the difference in linear phase from two symmetric pupil locations, we get the following expression for the electric field spilled into the center of the pattern:

$$E_C = \int_{time}\int_{LPR} [\text{Airy}(x,y) \times (e^{j\Phi_{LPR}(x,y)} - e^{-j\Phi_{LPR}(x,y)})] \times$$
$$(e^{j\Phi_{illum}(x,y)} + e^{-j\Phi_{illum}(x,y)}e^{-j\varphi(t)})$$

The term in brackets is the LPR design, which for symmetric target design locations, simplifies to $\text{Airy}(x,y) \times 2j \sin(\Phi_{LPR}(x,y))$.

Figure 20B:
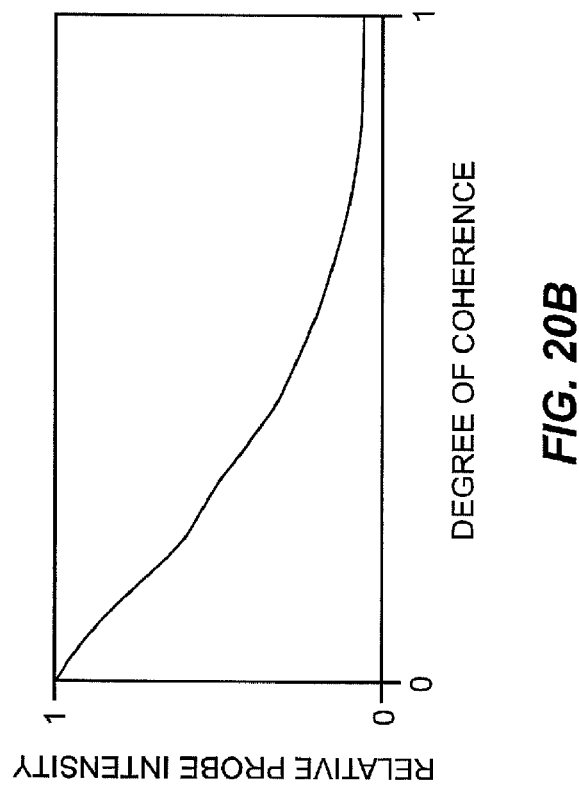
FIG. 20 illustrates temporal coherence monitor (a) mask pattern and (b) relative sensitivity to degree of coherence between two symmetric pupil locations.
Figure 20A:
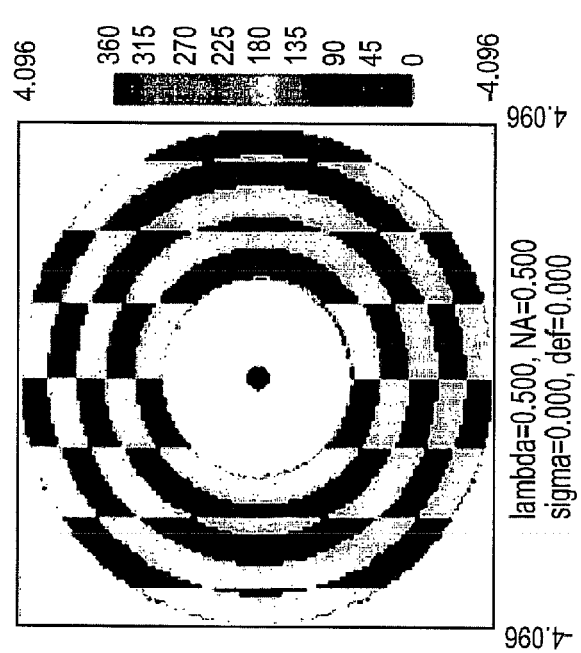

When the phase of the term in brackets is realized on a mask, we see in FIG. 20a that the design only requires two phases for the pattern rings. However, a 90° probe is required to interact with and measure the imaginary portion of the expression above since we are only concerned with a difference in phase. Thus, considering illumination only from the two symmetric target design locations and assuming comparable intensities, the degree of coherence between the locations is measured. If the illumination from these two pupil locations are completely temporally coherent (i.e. $\phi(t)$ is constant with time), then the target will cause the electric fields spilled from the two illumination locations through the pattern to destructively interfere at the probe position. Probe intensity will be at a minimum and will be due to only the probe contributions. Conversely, if the two locations are completely temporally incoherent ($\phi(t)$ is random), as they should be, the target will simply average the two location intensities. A theoretical plot of this behavior is seen in FIG. 20b, which displays the decrease in probe position intensity with an increasing degree of coherence.

The dimensions of interest for the LPR are the radius, linear phase period, probe size and phase depth. The ring outer radius of the Nth ring is determined by the Airy pattern as approximately:

$$R_{out}(N) \cong (0.6 + 0.5N)\frac{M\lambda}{NA},$$

where M is system magnification. The period of the phase regions is dependent on the target design illumination spot ($\sigma_{Target}$) as:

$$P = \frac{1}{(\sigma_{Target})}\frac{M\lambda}{NA}.$$

If used, the diameter of the probe is arbitrary, but must be designed appropriately to provide a signal on order of that from the pattern for the illuminator under analysis. Generally, the probe diameter will be about $$D_{probe} \cong 0.4\frac{M\lambda}{NA}.$$

Finally, the maximum phase depth for the 270° region is about 1.5λ, assuming an index of refraction of 1.5. Although the 3 phase etches may require special attention and cost, the mask requirements are certainly within current mask making capabilities.

Toleration requirements for fabrication of a 4-phase linear grating reported in McIntyre and Neureuther, Proc. SPIE 5040 pp. 162-170, 2003. Although LPR CD and phase toleration requirements are not addressed here, the similarity of the 4-phase implementations imply fairly robust LPR tolerances.

The linear phase ring, a phase shifting mask pattern, has been introduced to create a central peak intensity for monitoring the illumination distribution. The large available signal and illumination angular discrimination allow flexibility in the LPR design to measure most illuminators, although it is most advantageous for monitoring dipoles or quadrupoles. Measurement involves simply determining the intensity at the center of the pattern. Simulation studies of a four-phase implementation show a possible signal sensitivity of 30% of the clear field for a 0.02 pupil shift. The signal levels are sufficiently high that the monitors can be used directly in production without special exposure conditions. A similar target with only two phases can measure the degree of temporal coherence between two pupil locations.

The interferometric-probe monitor (IPM), to measure effective phase and transmission errors in the phase-shifted regions of a PSM. A two-phase pattern is designed to coherently spill electric field into the center of the target if either a phase and/or transmission imbalance exists between the phase regions. Due to the orthogonality of phase and transmission errors, a sub-printable interferometric probe of either 0 or 90 degree phase allows amplification and detection of either type of error. Errors are quantified by comparing probe response to a nearby, identical but isolated probe. As an example, for an alternating 0-180 degree PSM (Alt-PSM), a 90 degree probe amplifies phase error where a 0 degree probe amplifies transmission error. Sensitivity of the monitor is related to the pattern size and can achieve up to 1% of the clear field per 1° phase error with only a five-ring design (radius=3.1 $\lambda$/NA). Achievable sensitivity clearly outperforms existing measurement techniques for feature sizes with one dimension less than 0.5$\lambda$/NA. Phase and transmission errors can be compared among various feature types and sizes and among different locations in the field.

The finite size of the optics in projection printing tools result in the inability to exactly replicate mask patterns onto the wafer. Rather, interference effects of light captured within the pupil degrade imaging and result in the proximity effect. This is a familiar lithographic phenomenon where the electromagnetic influence of an object point on an image point depends on the wavelength of light, size of the lens, distance between points and state of illumination. For coherent illumination (very small sigma) this proximity effect is the well-known Airy function, also referred to as the electric-field point spread function (PSF). Thus, any arbitrary clear field location A in the object plane (reticle) will contribute electric field to any other arbitrary location C in the image plane (wafer) dependent on the magnitude and phase of the point spread function centered on point A. By reciprocity, we can say that the influence on point C by any and all mask locations is simply the point spread function centered on point C. Thus, any point equidistant from the center location will have the same influence at that point.

Considering only two small open mask locations, A and B, equidistant from point C, the total electric field at C is (see FIG. 21):

$$E_C = E_{A \Rightarrow C} + E_{B \Rightarrow C} = (\text{Airy}_A \times T_A \times e^{i\Theta_A} \times d\text{Area}_A) + (\text{Airy}_B \times T_B \times e^{i\Theta_B} \times d\text{Area}_B)$$

where $T_A$, $\phi_A$, $T_B$, $\phi_B$, are the transmission and phase of points A and B, respectively. Since the magnitude and phase of the Airy function are identical at the two locations, we define a differential geometric factor as follows:

$$dG = \text{Airy}_A \times d\text{Area}_A = \text{Airy}_B \times d\text{Area}_B$$

Thus rewriting the electric field at C:

$$E_C = (T_A e^{i\Theta_A} + T_B e^{i\Theta_B}) dG$$

If the phase and transmittance of both locations are identical, the fields due to each will coherently add. Likewise, if location B is 180 degree phase-shifted (i.e. $\phi_A=0$, $\phi_B=180°$), the fields will coherently subtract, resulting in no net electric field at C. However, should this phase difference be slightly other than 180 due to a phase error in B (i.e. $\phi_A=0$, $\phi_B=185°$, $\Delta\phi_B=5°$), and assuming TA and TB are both 1, the resultant electric field at C can be written as:

$$E_C = (1 - \cos(\Delta\phi_B) + i \sin(\Delta\phi_B)) dG$$

Taking the complex conjugate, the time-averaged intensity at C is therefore:

$$I_C = [(1-\cos(\Delta\phi_B))^2 + \sin^2(\Delta\phi_B)] dG^2$$

Although the intensity at C will vary depending on phase error at B, addition of a sub-resolution, 90° phase interferometric probe located at C drastically increases this detector's sensitivity. The 90° probe adds an imaginary component to the electric field at C. With the appropriate choice of probe size and geometric factor (dG), this component dominates the intensity, increasing its sensitivity to $\Delta\phi_B$ as follows:

$$E_C(90) = [1-\cos(\Delta\phi_B) + i \sin(\Delta\phi_B)] dG + i Im(E_P)$$

$$I_C(90) = (1-\cos(\Delta\phi_B))^2 dG^2 + [\sin(\Delta\phi_B) dG + Im(E_P)]^2$$

Note that for small phase errors ($\Delta\phi_B$), the first term becomes negligible. Likewise, a transmission error between A and B is amplified with the use of a 0° probe, which adds a real electric field component:

$$E_C(0) = Re(E_P) + [1-\cos(\Delta\phi_B) + i \sin(\Delta\phi_B)] dG$$

$$I_C(0) = [Re(E_P) + (1-\cos(\Delta\phi_B)) dG]^2 + \sin^2(\Delta\phi_B) dG^2$$

Figure 21:
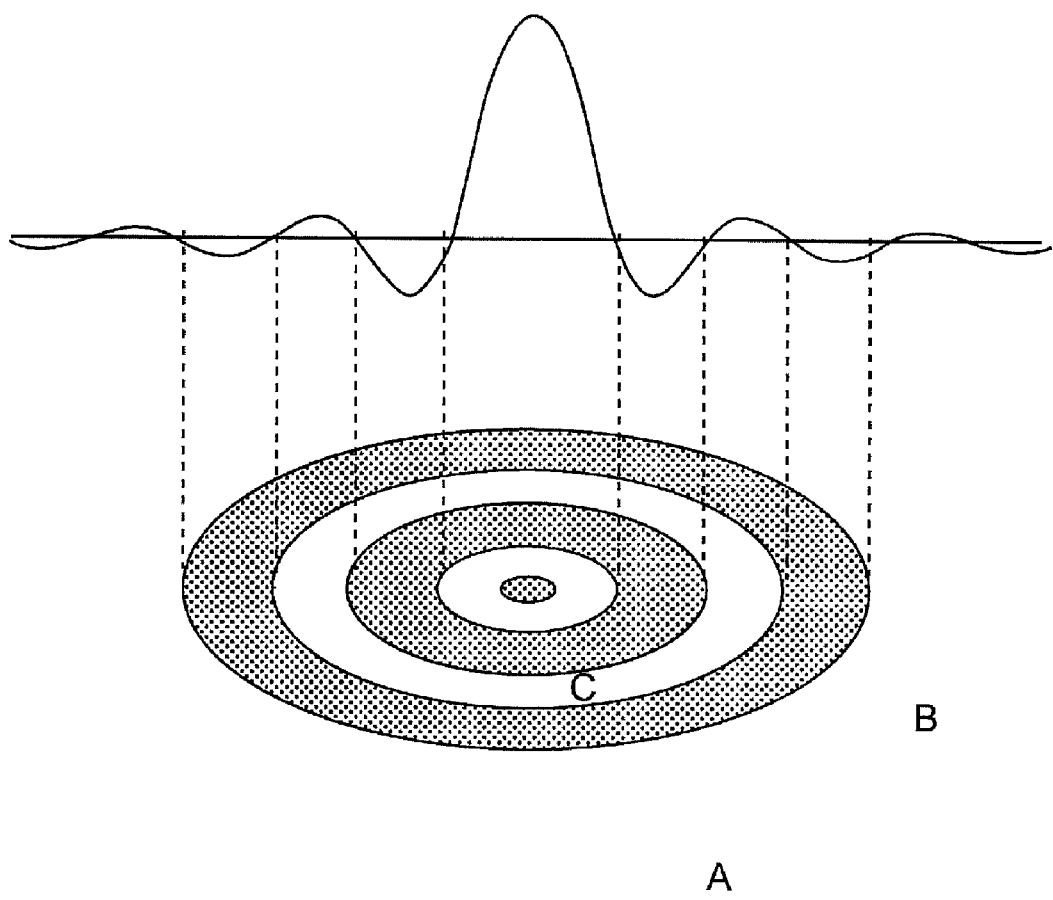
FIG. 21 illustrates influence function (PSF) on center location with coherent illumination.

FIG. 21 shows the influence of two equidistant points on the center of a circular target with coherent illumination. A 0 or 90 degree probe at location C enables detection of either phase or transmittance error between the two locations. Signal strength is related to the size of the openings. Thus, assuming errors due to processing are similar for all 180° regions, a larger signal is obtained by simply increasing the size of the two openings. IPM functionality is maintained as long as the target design consists of equal openings of 0 and 180° phase at any particular radius. An example set of targets for measuring errors in phase trenches is shown in FIGS. 22a and 22b. The placement of 0 and 180 regions is completely arbitrary and was chosen only to minimize the impact of lens aberrations.

SPLAT simulation of these targets clearly show how the 90° and 0° probe targets are sensitive to phase and transmittance, respectively, and is shown in FIGS. 22c and 22d. As the phase of the shifted regions is varied from 180 to 190, the intensity of the 90° target probe increases while the 0° target probe remained constant. Conversely, as the transmittance of the shifted regions is varied from 100% to 80%, only the 0° target probe shows sensitivity. The response for both conditions is linear with error and is consistent with the theory described herein. These particular targets show sensitivities of 0.7% of the clear field intensity per degree of phase error with a 90° probe and 0.6% of the clear field intensity per degree of transmittance error with a 0° probe.

Figure 23:
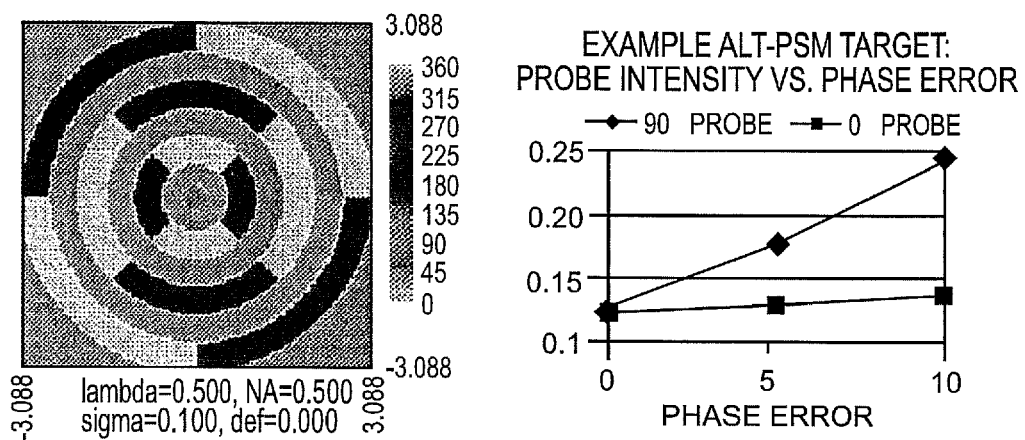
FIG. 23 illustrates a correctly designed target with more open rings shows increased sensitivity.
Figure 24:
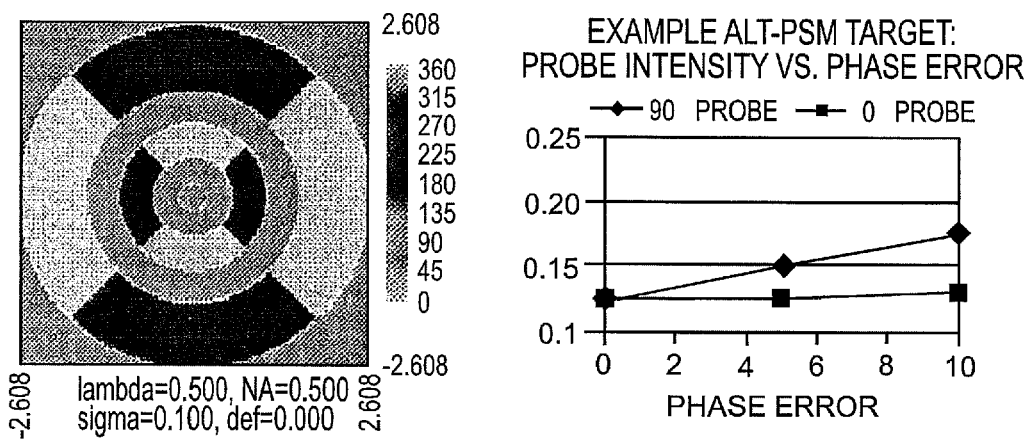
FIG. 24 illustrates that targets must consist of only openings in alternating rings due to the alternating signs of the Airy pattern. Otherwise, sensitivity is lost as shown here.

Since signal strength is related to the size of the pattern, sensitivity is improved simply by extending the area of the phase regions, thus increasing the geometric factor [$G=\int dG=\int Airy_A dArea_A$]. With the addition of phase regions in the 5$^{th}$ Airy ring, FIG. 23 shows improvement in phase sensitivity to over 1% of the clear field intensity per degree of phase error. However, due to the alternating sign of the Airy pattern with successive ring number, targets must consist only of openings in alternating rings, either even or odd. For example, the addition of the fourth ring in FIG. 24 adds a negative geometric factor, ultimately decreasing the target's sensitivity.

Figure 25:
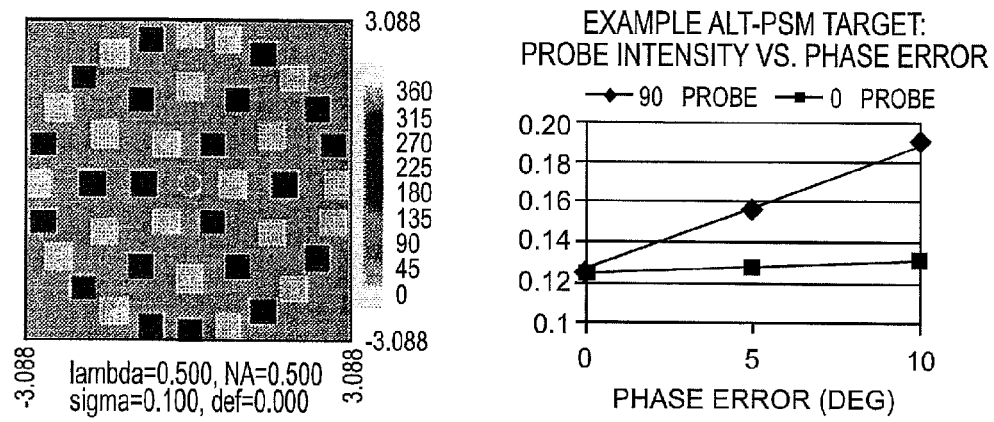
FIG. 25 illustrates the sensitivity of determining effective phase and transmission error in an array of properly designed alternating contacts depends only on the number of contacts used.

The targets described thus far measure effective phase and transmission in trench features, thus closely approximating the behavior of alternating line and space patterns. However, various feature types are analyzed by simply altering the mask design. For example, FIG. 25 displays an array of alternating contacts. Again, a 90° or 0° probe will measure the effective phase or transmittance error, respectively, in each 180° contact. The sensitivity is related only to the number of contact openings and the size of the probe. The design only requires that there be equal 0° and 180° openings for any given radius and that only alternating rings are used.

Figure 26:
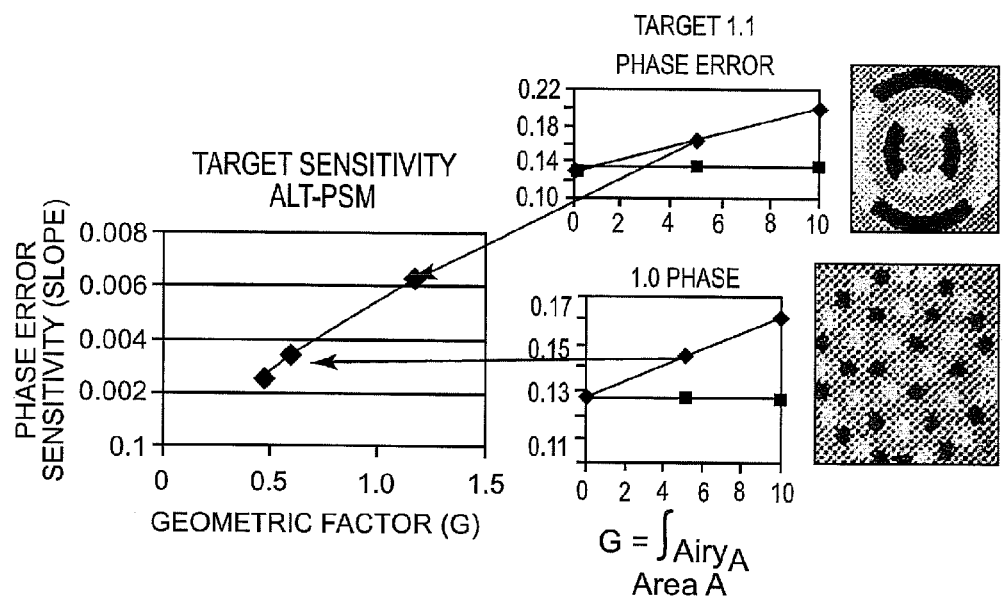
FIG. 26 illustrates target sensitivity for phase error depends linearly on geometric factor for a given probe size.

Clearly, target sensitivity is related to pattern size. FIG. 26 illustrates this relationship by linearly relating phase error sensitivity (slope) to geometric factor (G) for a particular probe size. Here we assume no transmittance error and see that for a 0.2 λ/NA radius probe, the phase error slope is 0.534*G. Thus, to determine phase error for a particular feature, a target consisting of that feature and a 90° probe is designed satisfying the discussed design requirements. The geometric factor is calculated depending on the mask design. The mask is then exposed, comparing target probe intensity to a near-by identical, but isolated, probe. Phase error sensitivity for that pattern is predicted by plotting a line of appropriate slope (determined by the geometric factor and probe size) originating from the isolated probe intensity. Finally, the measured target probe intensity is fit to this prediction to determine phase error.

A similar experimental process using a 0° probe measures transmittance error, assuming no phase error is present. Again, the relationship between error slope and geometric factor is linear and for a 0.2 λ/NA radius probe, goes as: transmittance error slope=0.254*G.

Here we have assumed that only phase error is present for the 90° probe measurement and only transmittance error is present for the 0° probe measurement. However, only some accuracy is lost should these assumptions be false since transmittance error has only a very small effect on the phase target (90° probe) and vice-versa. The next section discusses a more detailed analysis of the probe response, taking into consideration both errors simultaneously and is valid for PSMs with phases other than 0° and 180°.

Although current mask making technology would principally require analysis of 180° phase shifted regions, this technique is also valid for features of any phase or when both regions are phase-shifted. This more general application of this interferometric-probe technique again involves two similar targets, differing only by the phase of their probes. Referring to the derivation above, we rewrite the probe intensity relations for both a 0° and 90° probe target for any phase-shift ($\phi_B$) and transmittance ($T_B$):

$$I_C(90)=G^2(1+T_B\cos(\phi_B))^2+[Im(E_P)+G\times T_B\sin(\phi_B)]^2$$

$$I_C(0)=[Re(E_P)+G(1+T_B\cos(\phi_B))]^2+(G\times T_B\sin(\phi_B))^2$$

Figure 27:
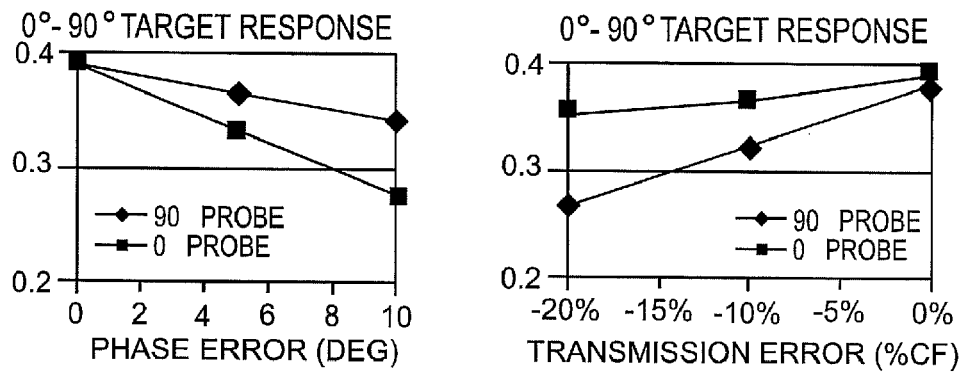
FIG. 27 illustrates that targets can be designed to measure imbalance of any phase features with response of a target similar to FIG. 22 (except with 0-90°, not 0-180°) is shown here.

Note we have assumed $T_A=1$ and $\phi_A=0°$, since no error is likely in the non-shifted regions. Since both the geometric factor (G) and the probe contribution to the electric field ($E_P$) are determined by the design and intensities are measured in experiment, we simply have two equations with two unknowns. Thus, the phase and transmission of any phase-shifted feature, which conforms to the design specifications described above, is characterized by exposing two targets and two isolated reference probes through dose. The reference probes quantify the real and imaginary $E_P$ once the square root is taken of the measured intensities. Finally, $T_B$ and $\phi_B$ are found from the above equations with simple numerical iteration. An example is shown in FIG. 27, where probe response is shown for a set of targets very similar to those in FIG. 22, except that the pattern consists of 0° and 90° regions, not 0° and 180°. Both 0° and 90° probes respond differently to errors in phase and transmittance, however the two measurements are enough to determine both errors quantitatively.

Furthermore, this technique remains applicable even if both regions (1 and 2) are phase-shifted. For example, a common technique used to restore intensity balance in Alt-PSMs is to equalize edge scattering in the 0° and 180° regions by over-etching both equally.[6] In this case a similar analysis is possible, only with the following substitutions: $T_A=1$, $T_B=T_2-T_1$ and $\phi_A=0°$, $\phi_B=\phi_2-\phi_1$. Thus, $T_B$ and $\phi_B$ become simply the difference in transmission and phase of the two regions. This difference, not the true phase and transmission, is of primary concern with Alt-PSMs.

Figure 28:
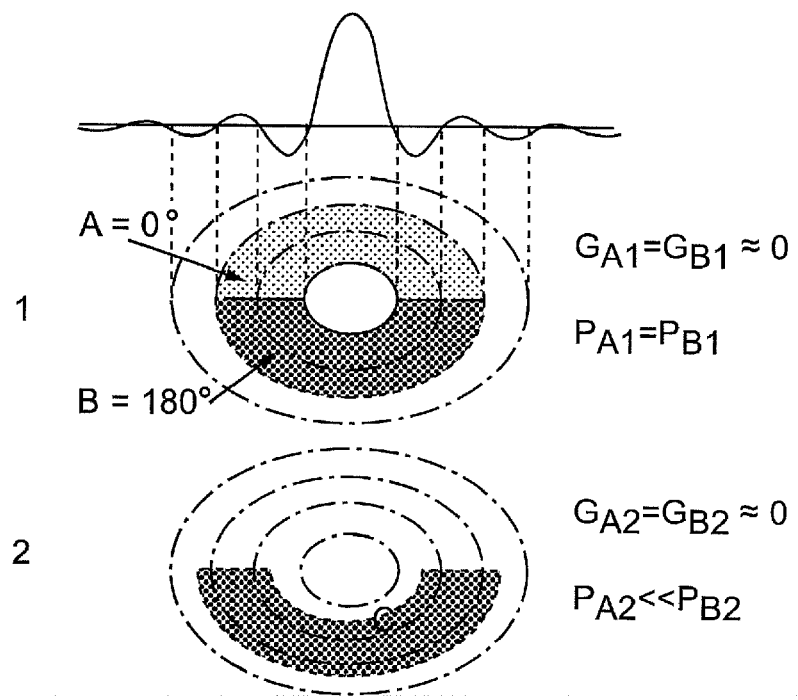
FIG. 28 illustrates probe response comparison measures edge effects due to difference in perimeter factors, both transmission and phase are measured with 0 and 90 probes.

Thus far the focus has been to determine phase and transmission error in PSMs, assuming errors were constant within each individual feature. However, due to the oscillating nature of the Airy pattern, some areas within a feature will have a larger influence than others, an effect that should be considered in analyzing results. Conversely, this characteristic of the Airy pattern could be used as another lever to calibrate other mask making concerns such as edge effects. FIG. 28 shows again how central influence depends on radius; ring centers have either a strong positive or negative influence while regions between rings have no influence at all. Thus, to determine the impact of edges, probe responses (both 0° and 90° probes) are compared between two targets similar to those in FIG. 28, which we name IPM-EDGE. Target 1 consists of identical 0° (A) and 180° (B) regions, each covering two adjacent Airy rings so the geometric factor (G) is nearly zero. Hence, this target is not sensitive to overall phase or transmission error. Target 2 is similar, except that the phase shifted region (B) is constructed so its total geometric factor is the same as region A. However, its perimeter falls somewhere in the middle of rings 1 and 3, not between rings like Target 1. Thus, any difference in the way these two targets respond results directly from edge effects.

The total electric field at the center can then be approximated as:

$$E_C=E_{Probe}+(P_B-P_A)T_{perimeter}e^{i\theta_{perimeter}}$$

Where P denotes a perimeter factor and is determined from the design as $$P_A = w\int_{perimeterA} Airy_A\, dl,$$

and w is an effective edge width (perhaps 0.01 λ/NA). Since $P_B=P_A$ for Target 1, the response is simply $E_{Probe}$. This acts as a reference for Target 2 and quantifies $E_{probe}$. A similar process to that described in Section 4 is used to extract the effective phase and transmission of the edges ($T_{perimeter}$ and $\phi_{perimeter}$) with Target 2. Two targets with different probes again produce two equations with two unknowns ($T_{perimeter}$ and $\phi_{perimeter}$), which are solved by iteration. The results give the effective phase and transmission of an edge region considered to have width w.

Additionally, the logic used in creating these monitors has implications for EDA integration and design for manufacturability, such as a target design to be used as a lateral test function in a novel fast-CAD pattern matching system reported by Gennari et al. in Proc. SPIE 4692 B-54 (2002) and Proc. SPIE 4889 (2002). This system incorporates fast process models with EDA layout management to identify and help arbitrate locations on a chip most susceptible to various process errors such as lens aberrations, CMP dishing, and reflective notching. But since infinite possible IPM configurations exist, no single pattern could serve as a lateral test function to identify mask locations most susceptible to phase and transmission errors. However, an algorithm based on the IPM-PSM technique could potentially be built in to the pattern matching software. For example, the influence of phase-error residual effects from the surrounding layout, weighted appropriately by the Airy pattern, could be calculated for a particular mask location. Depending on the phase of the intended feature at that location, either the real or imaginary part of this residual effect would be of concern. The magnitude of these effects and how they interact with the existing feature would be compared to a threshold, thus identifying potential sites susceptible to the effects of phase error.

The effect of aberrations, probe fabrication errors and partial coherence are of interest, but prove to have little to no substantial influence on a properly designed IPM-PSM's sensitivity. The design versatility allows the engineer to minimize the impact of aberrations by constructing the surrounding pattern to be nearly orthogonal to all Zernike polynomials of concern. For example, the targets displayed in this paper behave well under the influence of lens aberrations, showing less than 4% variation in probe intensity with 0.01 λ (rms) of the most common Zernike terms. Additionally, the IPMs used to monitor Alt-PSMs are very insensitive to probe fabrication errors. Probe transmission uncertainty is built into the analysis technique by the use of a nearby, identical and isolated probe. Errors in probe phase have negligible effect due to the nature of the time-averaged intensity, which is evident upon inspection of the intensity equations for both probe types. Furthermore, although completely coherent illumination is ideal, partially coherent illumination (small σ) only slightly degrades target sensitivity and is easily accounted for in the theory by consideration of the mutual coherence function.

Finally, the detection sensitivity possible with this technique out-performs existing techniques for many useful feature types. Direct interferometric methods usually involve an illumination scheme much different than that used in a lithography-printing tool. While they have the ability to very accurately measure actual etch depth, they will not predict effective intensity and phase imbalance caused by the three-dimensional nature of a PSM. Most other existing techniques rely on image-plane analysis, like the method presented here, but fail to meet the sensitivity feasible with the IPM-PSM. These techniques generally compare images of a two-phase pattern exposed through focus and dose to simulation, indirectly measuring phase error. For example, the peak image-plane intensities of two adjacent openings of opposite phase will vary depending on phase and transmission imbalance. Extraction of each error is possible by analyzing the thru-focus behavior, assuming best focal position is known. However, the sensitivity of this approach is highly dependent on feature size, and is optimal for two small, directly adjacent features as seen in FIG. 29 (L=0.5, S=0). Considering only phase error, the amount the peak intensities differ is greatest for a 0.5λ/NA opening without chrome. However, when both openings and spacer are 0.5λ/NA or for a case such as alternating contacts, sensitivity considerably declines. For comparison, the performance of the five-ring IPM-PSM from FIG. 23 is displayed in FIG. 28 with a dotted line. Clearly the IPM shows comparable sensitivity to the best-case scenario with the through focus technique. Note that much greater sensitivity is readily available by simply using more target rings.

A phase-shifting mask pattern has been introduced to evaluate effective phase, transmittance and edge effects of the shifted regions in a PSM. The coherent interaction between an interferometric-probe and a surrounding pattern allows sensitive detection while the orthogonality of phase and transmission errors enables two distinguishable measurements. Monitors can be used on a special test mask or included in the layout of a production mask and can be analyzed with either an AIMS tool or printed resist from a projection printing tool exposure. Actual mask performance is analyzed for a particular feature, to include the effects of real mask making errors as well as effective electromagnetic printing effects. Good sensitivity is available for both phase trenches and contacts and is limited only by the number of features built into the design. Monitors are relatively insensitive to aberrations and probe-phase manufacturing errors. They show improved performance for many feature types over existing techniques and do not require through-focus analysis.

While the invention has been described with reference to specific embodiments, the description is illustrative of the invention and is not to be construed as limiting the invention. Various modifications and applications may occur to those skilled in the art without departing from the true scope and spirit of the invention as defined by the appended claims.

What is claimed is:

1. A phase-shifting mask pattern for use in characterizing illumination in an optical system adapted for projection printing of integrated circuits, the phase-shifting mask pattern comprising a linear phase ring having a phase-shifted element adapted to:
   coherently spill light into a center position of a target only for illumination, the spilled light arriving from a location designed for a given illumination arrival angle; and
   create a signal sensitive to illumination state or mask quality, wherein coherent proximity effect spillover of a surrounding pattern on the center position creates the signal sensitive to the illumination state or the mask quality.

2. The phase-shifting mask pattern as defined by claim 1, further including a phase-sensitive probe at the center position for use in detecting phase error or transmittance error between a plurality of clear field locations in the phase-shifting mask pattern on the center position in an image plane.

3. The phase-shifting mask pattern as defined by claim 1, wherein the linear phase ring comprises a plurality of linear phase gratings configured to coherently spill the light into the center position from the given illumination arrival angle.

4. The phase-shifting mask pattern as defined by claim 1, wherein the phase-shifting mask pattern further comprises at least two openings disposed within the linear phase ring, wherein each of the at least two openings are spaced equidistant from the center position of the target and phase-shifted 180 degrees.

5. The phase-shifting mask pattern as defined by claim 1, wherein the phase-shifted element defines a stepped pattern for the linear phase ring.

* * * * *